United States Patent [19]
Linehan et al.

[11] Patent Number: 5,461,329
[45] Date of Patent: Oct. 24, 1995

[54] METHOD AND APPARATUS FOR GENERATING MOTOR CURRENT SPECTRA TO ENHANCE MOTOR SYSTEM FAULT DETECTION

[75] Inventors: Daniel J. Linehan, Knoxville; Stanley L. Bunch, Oak Ridge; Carl T. Lyster, Knoxville, all of Tenn.

[73] Assignee: Martin Marietta Energy Systems, Inc., Oak Ridge, Tenn.

[21] Appl. No.: 218,966

[22] Filed: Mar. 25, 1994

Related U.S. Application Data

[63] Continuation-in-part of Ser. No. 823,691, Jan. 21, 1992, abandoned.

[51] Int. Cl.$^6$ .................. G01R 31/34; G01R 23/16
[52] U.S. Cl. .......................... 324/772; 364/576
[58] Field of Search .................. 324/772, 537, 324/545, 546; 364/726, 576

[56] References Cited

U.S. PATENT DOCUMENTS

| | | | |
|---|---|---|---|
| 2,591,738 | 4/1952 | Spencer | 324/76.13 |
| 2,624,770 | 1/1953 | Yetter | 324/102 |
| 4,156,846 | 5/1979 | Harrold et al. | 324/772 |
| 4,303,882 | 12/1981 | Wolfinger | 324/772 |
| 4,305,132 | 12/1981 | Tsuboshima et al. | 364/574 |
| 4,527,101 | 7/1985 | Zavis et al. | 318/245 |
| 4,678,990 | 7/1987 | Bicknell et al. | 324/772 |
| 4,744,041 | 5/1988 | Strunk et al. | 364/565 |
| 4,751,657 | 6/1988 | Imam et al. | 364/576 |
| 4,761,703 | 8/1988 | Kliman et al. | 324/545 |
| 4,808,932 | 2/1989 | Schulz, Jr. et al. | 324/545 |
| 4,965,513 | 10/1990 | Haynes et al. | 324/772 |
| 4,978,909 | 12/1990 | Hendrix et al. | 324/772 |
| 5,049,815 | 9/1991 | Kliman | 324/772 |
| 5,252,915 | 10/1993 | Sedding et al. | 324/772 |

OTHER PUBLICATIONS

"Condition Monitoring of Machinery Using Motor Current Signature Anly" Kryter, et al., Sound and Vibration, Sep. 1989, pp. 14–21.
"An On–Line Computer Based Current Monitoring System for Rotor . . . " Thomson, et al. Turbomachinery International Nov. 1987, pp. 17–24.
Id. Case Study of a Method for Diagnosing AC Industion Motors Using Spectrum Analysis, Jim Reis Entek Scientific Corp., pp. 40–44.
Proceedings of 1st Inter. mach. Mon. and Diag. Conf. Broken Bar Detector For . . . Motors Kliman, Koegl et al. 674–682 (1989).

*Primary Examiner*—Ernest F. Karlsen
*Attorney, Agent, or Firm*—Martin J. Skinner; Jeffrey N. Cutler; James M. Spicer

[57] ABSTRACT

A method and circuitry for sampling periodic amplitude modulations in a nonstationary periodic carrier wave to determine frequencies in the amplitude modulations. The method and circuit are described in terms of an improved motor current signature analysis. The method insures that the sampled data set contains an exact whole number of carrier wave cycles by defining the rate at which samples of motor current data are collected. The circuitry insures that a sampled data set containing stationary carrier waves is recreated from the analog motor current signal containing nonstationary carrier waves by conditioning the actual sampling rate to adjust with the frequency variations in the carrier wave. After the sampled data is transformed to the frequency domain via the Discrete Fourier Transform, the frequency distribution in the discrete spectra of those components due to the carrier wave and its harmonics will be minimized so that signals of interest are more easily analyzed.

12 Claims, 23 Drawing Sheets

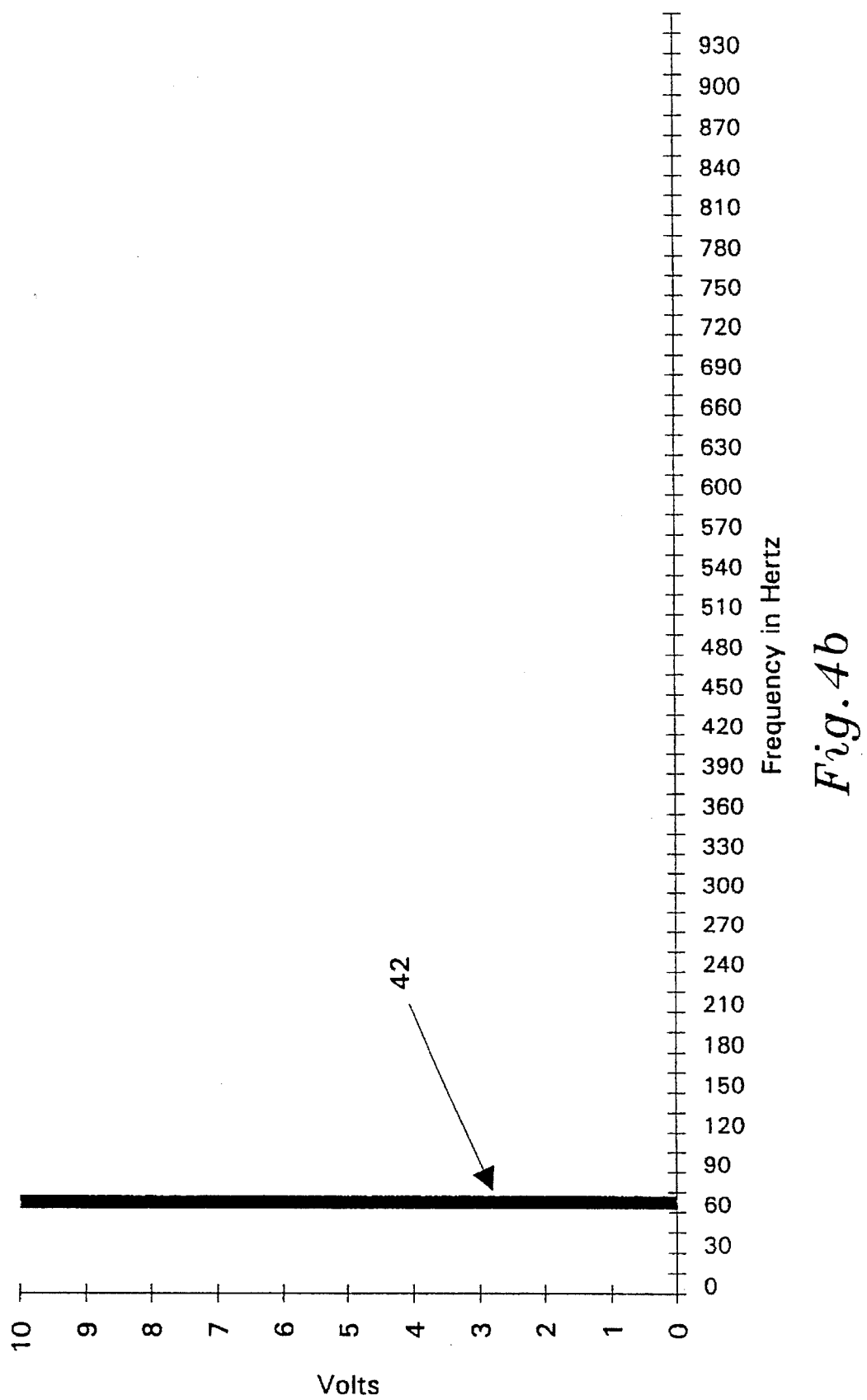

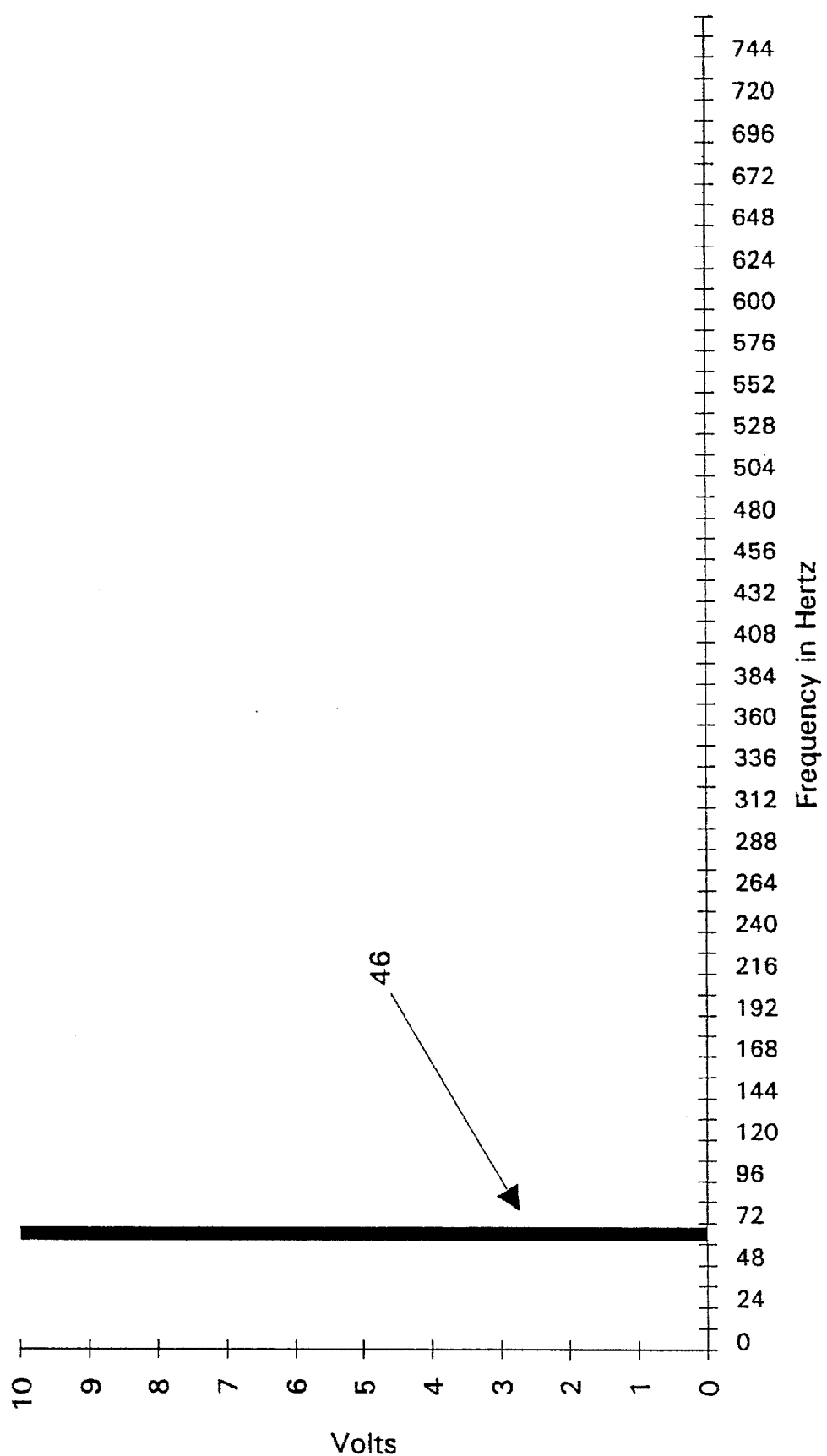

METHOD AND APPARATUS FOR GENERATING MOTOR CURRENT SPECTRA TO ENHANCE MOTOR SYSTEM FAULT DETECTION

This invention was made with Government support under contract DE-AC05-840R21400 awarded by the Department of Energy to Martin Marietta Energy Systems, Inc. and the Government has certain rights in this invention. This is a Continuation-in-Part patent application based upon parent application Ser. No. 07/823,691 filed Jan. 21, 1992, now abandoned.

TECHNICAL FIELD

This invention relates to the field of frequency detection of periodic modulations on a periodic carrier wave. More specifically, it relates to an improved motor current spectrum analysis method used as a diagnostic aid for detecting potential failures of rotating equipment. The method specifically minimizes the spectral distribution of power source components in the frequency domain.

BACKGROUND ART

Motor current spectrum analysis (MCSA) is a cost effective and non-intrusive method for the condition monitoring of rotating equipment. The operational conditions of rotating equipment can be analyzed and related to the maintenance needs of such equipment. In analyses of this type, mechanical vibrations in alternating current (AC) rotating equipment are transduced back to the power lines via the motor. Electrical motor faults are also transduced back to the power lines. These transduced signals are in actuality very small amplitude modulators to the large AC power line current. As a result, the motor current signal can be characterized as a large sinusoidal carrier wave with small amplitude modulations (see 10 in FIG. 1), where the carrier wave is the result of the power source and the small amplitude modulations are the result of the motor and the mechanical system attached to the motor. In addition, the carrier wave is slightly phase and/or frequency modulated due to its nonideal power source. Consequently, the carrier wave is not time stable.

In the utilization of these signals, a current transformer is attached to a lead of an electrical motor, then these signals are conditioned, sampled and analyzed in the frequency-domain with the Discrete Fourier Transform (DFT). Vibration and motor fault data are displayed as peaks in the spectra. However, the large power line signal and its harmonics are also displayed in the spectra at a magnitude that can be several orders of magnitude greater than the signals of interest. The spectral content due to the large, unstable power line signal and its harmonics is expansive and Gaussian in nature when the motor current is sampled by conventional methods. As a result, any anomalies or abnormalities that have a frequency close to the frequency of the carrier wave and its harmonics are difficult to evaluate and precisely define (see FIG. 16).

The expansive spectral distribution, or spread, of the carrier wave and its harmonics over a range of frequencies in the DFT can be caused by several factors. Two of the more dominant factors are discussed below in detail. First, a nonstationary sinusoidal signal contains a range of frequencies, yielding a spectra with distributed energy about its average frequency. Since the carrier wave in the motor current can be characterized as a nonstationary sinusoidal signal, its resulting spectra will likewise contain a distribution of energy about its average frequency. Second, the process through which real, continuous, time-domain signals are transformed to the discrete frequency-domain can influence frequency resolution in the discrete spectra. The frequency-domain transformation of continuous time-domain signals utilizes the continuous Fourier transform and assumes the signal is infinite in duration. The DFT, however, operates on finite duration discrete time-domain signals. Consequently, the discrete time-domain signal may contain discontinuities at its beginning and ending data points, yielding illegitimate frequency content in the discrete spectra. To overcome this problem, windowing techniques have been developed to smooth these discontinuities prior to performing the DFT and, consequently, minimize their spectral content. However, as a side effect of windowing, the spectral content of authentic components is distributed over a range of frequencies. Since the motor current spectral components due to the carrier wave and its harmonics are very large in relation to the modulators, they will most drastically be influenced by windowing. Therefore, the frequency distribution of the carrier wave and its harmonics in the motor current spectra will be expansive due to windowing.

By employing conventional discrete data techniques, such as windowing, to motor current signals, determining the "health" of the rotating machine with the resulting spectra would be challenging because of the frequency content of spectral components due to the large, nonstationary carrier wave and its harmonics. In order to fully access the information contained in the motor current spectra concerning the health of the rotating machine, the expansive frequency distribution of spectral components due to the carrier wave and its harmonics must be addressed and resolved.

In certain prior art, the small modulators are demodulated from the carrier wave prior to sampling the motor current signal. While the signal to noise ratio is improved, since the carrier is eliminated prior to sampling the motor current, the bandwidth of the resulting spectrum is limited. As a consequence, higher frequency modulators cannot be analyzed since they are outside of the permissible frequency range. By eliminating the possibility of analyzing these higher frequency motor current components, only a limited knowledge can be gained concerning the health of the rotating machine.

In other certain prior art, methods have been implemented for initiating the sampling process with a real-time event. These methods determine when to begin sampling at a fixed rate and are useful in analyzing transients in the discrete time-domain. However, frequency-domain analysis is not improved since the frequency distribution of spectral components due to the carrier wave and its harmonics will be expansive due to both the effects of windowing and the fact that the carrier is nonstationary.

Accordingly, it is an object of the present invention to provide a method and apparatus to detect small amplitude modulators in a carrier wave at all frequencies with improved spectral frequency resolution by minimizing the distribution of those spectral components due to the carrier wave and its harmonics.

It is a further object of the invention to provide spectral frequency resolution enhancement by collecting a sampled data set completely filled with an exact whole number of stationary carrier wave cycles. The exact whole number of carrier wave cycles is accomplished with the invention method by insuring that the product of the carrier wave frequency and the time duration of the sampled data set equals a whole number. This whole number is the number of carrier wave cycles in the sampled data set.

Within this invention, the sampled data set duration is defined as the number of samples in the data set divided by the sampling rate. Therefore, a sampled data set completely filled with a whole number of carrier wave cycles can be created by selecting appropriate values for both the number of samples in the data set and the sampling rate.

It is also an object of the present invention to provide a method that specifies the actual sampling rate to be equal to the number of samples in the discrete data set multiplied by the carrier wave frequency divided by the number of whole carrier wave cycles in the sampled data set. The actual sampling rate should be selected so that it conforms to this relationship and is close in frequency to the desired sampling rate, which must be at least twice the desired maximum frequency to be processed by the DFT.

It is another object to create stationary discrete time-domain carrier waves from nonstationary analog time-domain carrier waves with apparatus of the present invention by varying the sampling rate with the frequency variations of the analog carrier wave. This is defined as "dynamically adjusting the sampling rate". Creating a stationary sampled signal from the nonstationary analog motor current signal is not possible by sampling the motor current signal at a fixed rate, as is traditionally done. As a result, the sampling rate must change with the motor current signal frequency variations.

Another object of the present invention is to provide for changing the sampling rate by a variable frequency clock generator, whose output frequency adjusts with the carrier wave frequency.

A further object is to provide for the implementation of the adjustable frequency clock generator which adjusts to and tracks with the variable frequency carrier wave through the use of a phase locked loop (PLL) circuit. The use of the PLL as a practical means of implementing the sampling process imposes the condition that $2^n$ samples are collected for each carrier wave cycle and the sampled data set consists of $2^n$ complete carrier wave cycles. In addition, to maximize its ability to accurately track the variation in frequency of the carrier wave, the adjustable frequency clock generator is specially configured. By doubling the frequency of the carrier wave prior to input into the PLL, the comparitor section of the PLL is forced to track twice as often for every sampled data set. As a result, the time variation between samples in the discrete data set is minimized and the analog signal is more faithfully replicated in the discrete time-domain.

Still another object of the present invention is to provide a method for enhancing motor system fault detection wherein no signal conditioning beyond that required by the Niquist criteria is performed. Rather, the process of converting a time-domain analog signal to the discrete frequency-domain is modified and the sampling rate is conditioned so that it adjusts to the frequency variations of the nonstationary analog carrier wave. Nor is windowing of the discrete time-domain data required as a part of this process since the sampled data set contains no discontinuities. Finally, since the motor current is conditioned only with a low pass filter, as required by the Niquist criteria, all information contained in the motor current spectra remains, providing the opportunity to more thoroughly determine the health of the entire rotating machine. By acquiring motor current data in this fashion, the spectral distribution of the carrier wave frequency and all its harmonics will be minimized, creating a motor current spectra with enhanced frequency resolution.

Other objects and advantages over the prior art will become apparent to those skilled in the art upon reading the detailed description together with the drawings as described as follows.

DISCLOSURE OF THE INVENTION

In accordance with the various features of this invention, a method and an associated electrical circuit for detecting periodic abnormalities, such as periodic amplitude modulations, in a nonstationary periodic carrier wave of a known average frequency are provided. With this method and circuitry, the frequency distribution of the discrete spectral components due to the carrier wave and its harmonics is minimized so that other spectral components due to the motor system are more easily analyzed. As a result, motor system fault detection is enhanced.

This reduction of frequency distribution of the discrete spectral components due to the carrier wave and its harmonics is accomplished by insuring that the discrete time-domain data set utilized for input to the DFT is completely filled with an exact whole number of stationary carrier wave cycles. The process for creating such a discrete time-domain data set is defined by both the invention method and the invention circuitry.

The invention method insures that the discrete time-domain data set contains a whole number of carrier wave cycles by insuring that an appropriate actual sampling rate is calculated based on the average carrier wave frequency, the desired maximum frequency to be analyzed in the discrete spectra, and the desired DFT resolution. This actual sampling rate is defined by the method as the number of samples in the discrete time-domain data set (which is twice the desired resolution), multiplied by the carrier wave frequency, and divided by the number of whole carrier wave cycles. The actual sampling rate should be determined so that it is close in value to the desired sampling rate, which is at least twice the desired maximum frequency to be analyzed in the discrete spectra.

The invention circuitry implements the appropriate actual sampling rate as defined by the method and also insures that the analog nonstationary carrier wave is recreated as a stationary carrier wave in the discrete time-domain. This is accomplished by utilizing an adjustable frequency clock generator to generate the sampling rate signal as apposed to utilizing a fixed frequency oscillator, as is traditionally done. The adjustable frequency clock generator adjusts its output frequency with the frequency variations of the nonstationary analog carrier wave. A preferred adjustable frequency clock generator circuit is described in this invention and utilizes a Phase Lock Loop (PLL).

Since the sampled carrier waves in the discrete time-domain data set are stationary, and since this data set is completely full of a whole number of stationary carrier wave cycles where no discontinuities exist, the frequency distribution of those discrete spectral components due to the carrier wave and its harmonics are minimized. As a result, discrete spectral peaks of interest in the motor current spectra are more easily analyzed so that diagnosis of motor system faults is enhanced.

BRIEF DESCRIPTION OF THE DRAWINGS

The above mentioned features of the invention will become more clearly understood from the following detailed description of the invention read together with the drawings in which:

FIGS. 4b and 4d show the resulting enhanced spectra, where no windowing is applied or required, using the present invention. This enhanced spectra can be compared with that of the prior art in FIGS. 3b and 3d.

FIG. 12a is normal scale while FIG. 12b is a zoom scale at one-one hundredth the normal magnitude.

FIG. 13a is normal scale while FIG. 13b is a zoom scale at one-one thousandth the normal magnitude.

FIG. 14a is normal scale while FIG. 14b is a zoom scale at two-one hundredths the normal magnitude.

FIG. 15a is normal scale while FIG. 15b is a zoom scale at five-ten thousandths the normal magnitude.

FIG. 16a is normal scale while FIG. 16b is a zoom scale at one-tenth the normal magnitude.

FIG. 17a is normal scale while FIG. 17b is a zoom scale at one-one hundredth the normal magnitude.

BEST MODE FOR CARRYING OUT THE INVENTION

Sampling periodic amplitude modulations of a nonstationary periodic carrier wave of a predetermined average frequency of the present invention is described first in terms of its method and then a preferred electrical circuit for implementation is described. It will be recognized by those skilled in the art that the present invention is particularly useful in analyzing any periodic amplitude modulation in any type of nonstationary periodic carrier wave in a number of instances such as, though certainly not limited to, extracting weak signals from radio frequency carrier waves, various electronic detectors that detect amplitude modulations and improved motor current signature analysis. While there are different uses for the present invention, the specification will describe in detail the use of the present invention in terms of improved motor current signature analysis.

Figure 1:
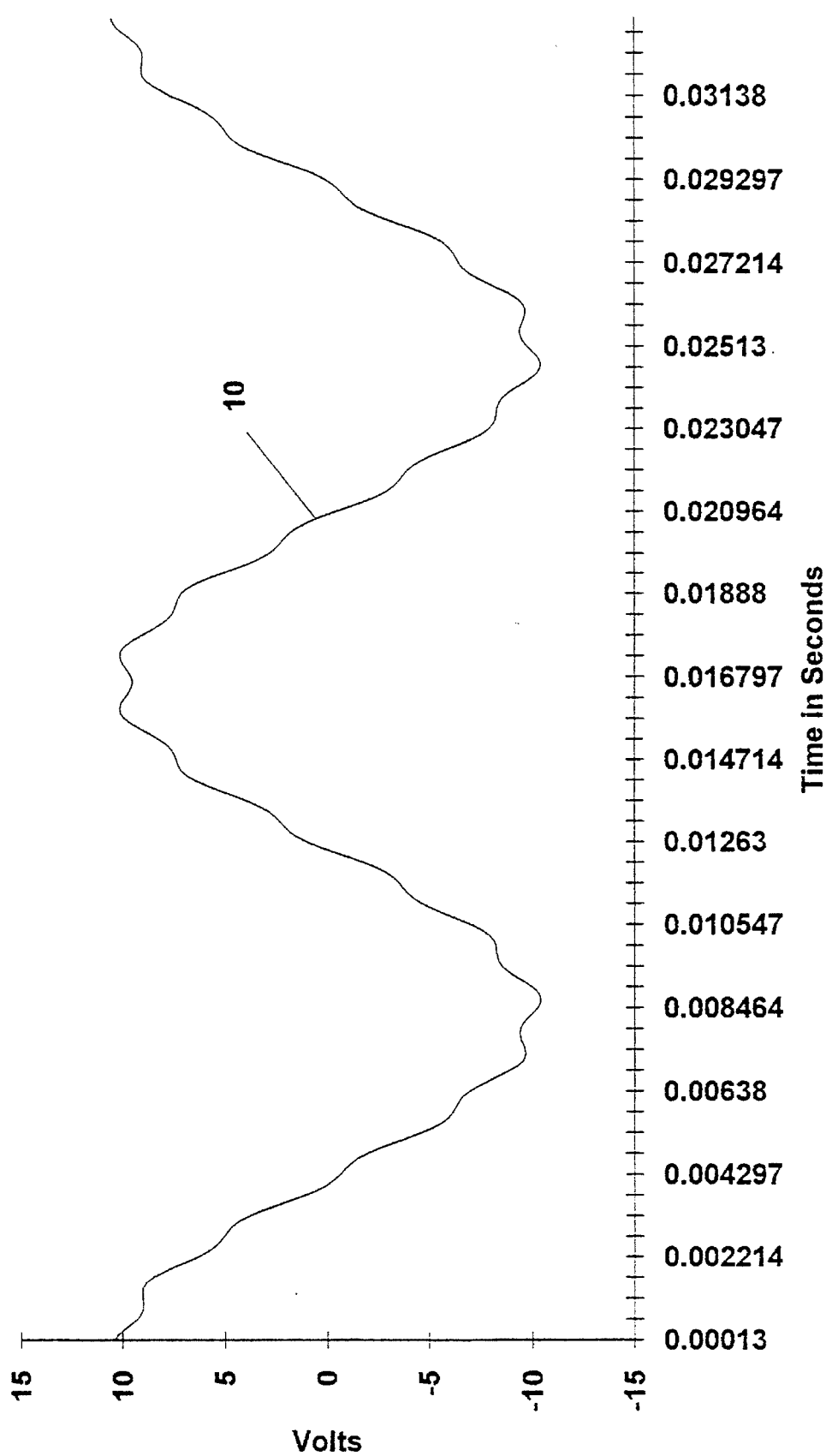
FIG. 1 shows the waveform characteristics of a typical motor current signal, which consists of small modulators (e.g., 0.5 Vpp) riding on a large periodic nonstationary sinusoidal carrier wave (e.g., 20 Vpp, at 630 Hz modulation).
Figure 2:
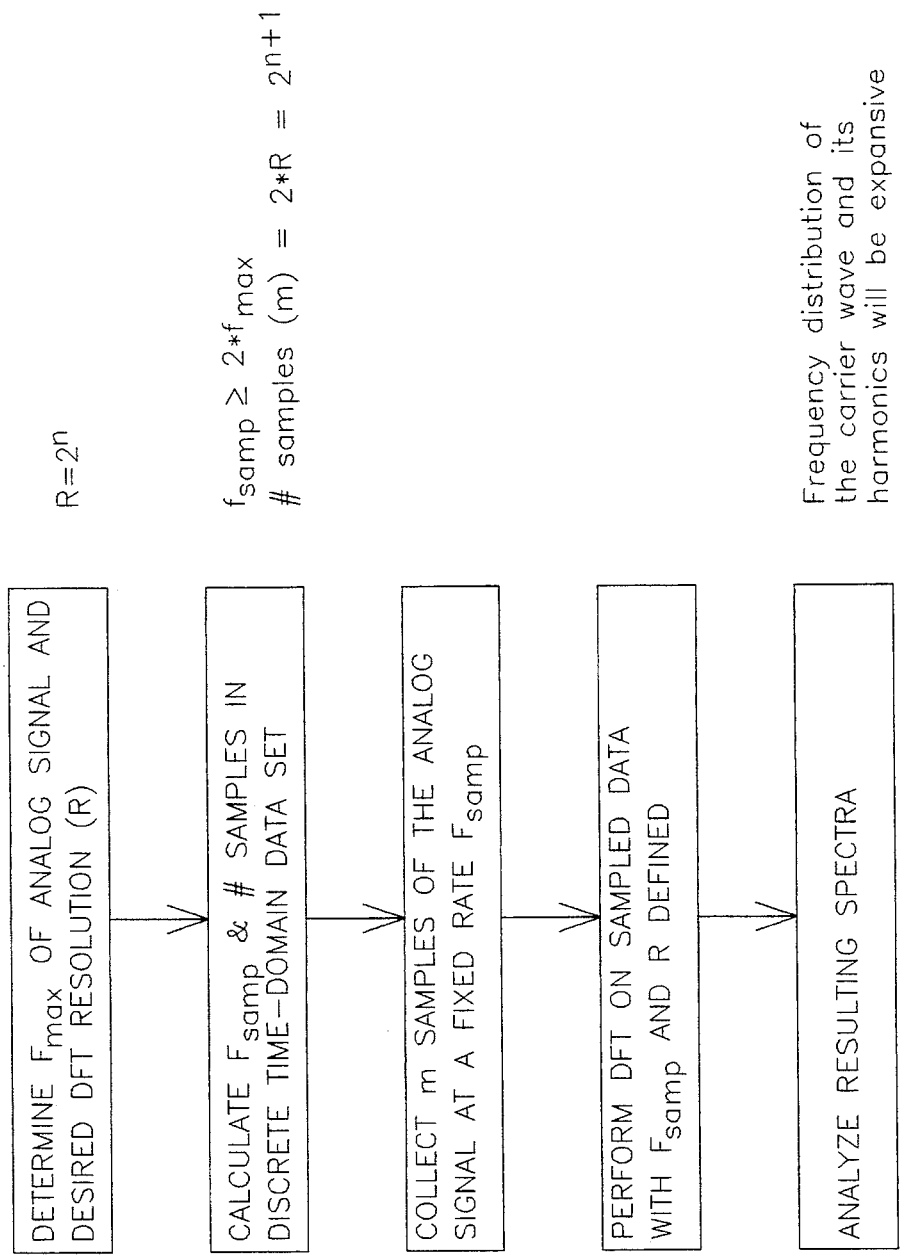
FIG. 2 is a flow diagram of the conventional sampling process for motor current analysis.

As in traditional motor current signature analysis (see FIG. 2), the motor current signal is acquired with a current transformer attached to one of the motor leads. This differential signal is converted to a single ended signal with an operational amplifier, and band limited with a low pass filter to avoid aliasing, as required by the Niquist criterion. Finally, this time-domain data is digitized with an analog-to-digital convertor (ADC), converted to the frequency-domain via the discrete Fourier transform (DFT), and analyzed. As previously mentioned, the DFT operates on discrete time-domain data which is of finite duration. Because discontinuities can occur in the finite duration discrete time-domain data at its beginning and ending points, windowing is conventionally applied prior to performing the DFT. While windowing minimizes the spectral content of these discontinuities, it also disperses the spectral content of authentic motor current components over a range of frequencies. Since the magnitude of the spectral components due to the carrier wave and its harmonics are much greater than other motor current spectral components, they are dispersed over a greater range of frequencies as a result of windowing. However, by insuring that the discrete time-domain motor current sampled data set is void of discontinuities, windowing and its unwanted effects can be avoided.

In order to eliminate discontinuities in the motor current time-domain sampled data set, two conditions must be met. First, the sampled data set operated on by the DFT must be completely full of samples derived from the analog motor current signal. Implications of this condition are that the same $2^n$ samples forming the discrete time-domain data set must be utilized by the DFT, since the DFT is a binary algorithm and operates on a data set of $2^n$ samples. A conventional practice sometimes employed is the use of zero padding, which completes a discrete time-domain data set by adding zero valued samples to it. However, zero padding of discrete time-domain data sets creates discontinuities and, therefore, requires windowing to minimize its impact in the spectra. Second, reconstruction of a discrete, infinite duration motor current signal based on replicas of the sampled data set must not yield discontinuities. Implications of this condition are that the discrete time-domain data must be symmetric. An infinite duration signal based on replicas of an asymmetric discrete data set will contain discontinuities and, therefore, require windowing.

Figure 3A:
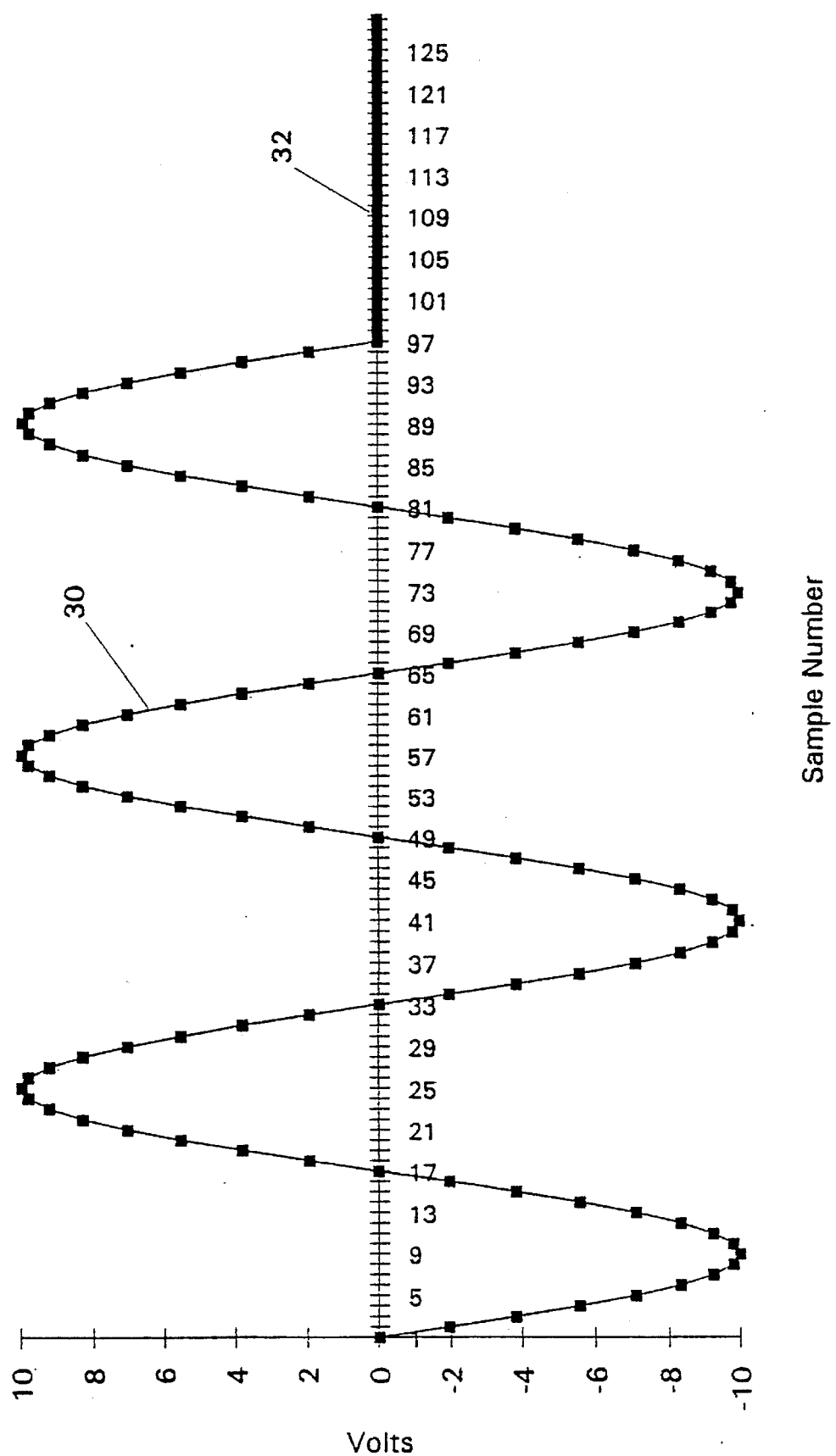
FIGS. 3a and 3c are discrete time-domain sampled data sets which contain discontinuities due to the conventional sampling process of FIG. 2.
Figure 3B:
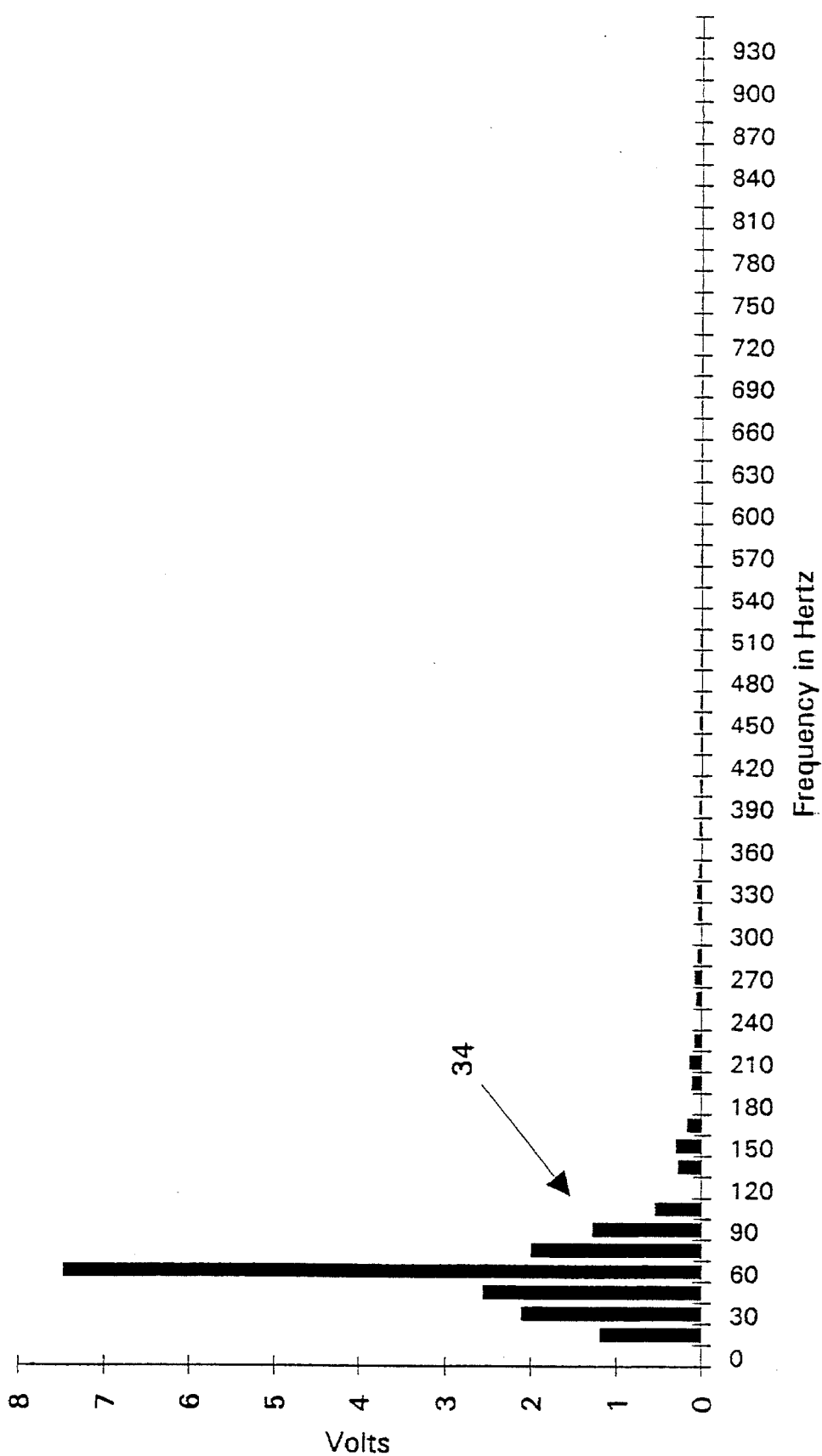
FIGS. 3b and 3d are the discrete spectra, where no windowing techniques are applied, of data of FIGS. 3a and 3c, respectively, and show the effects of discrete time-domain data which contain discontinuities when using the sampling process of FIG. 2.
Figure 3C:
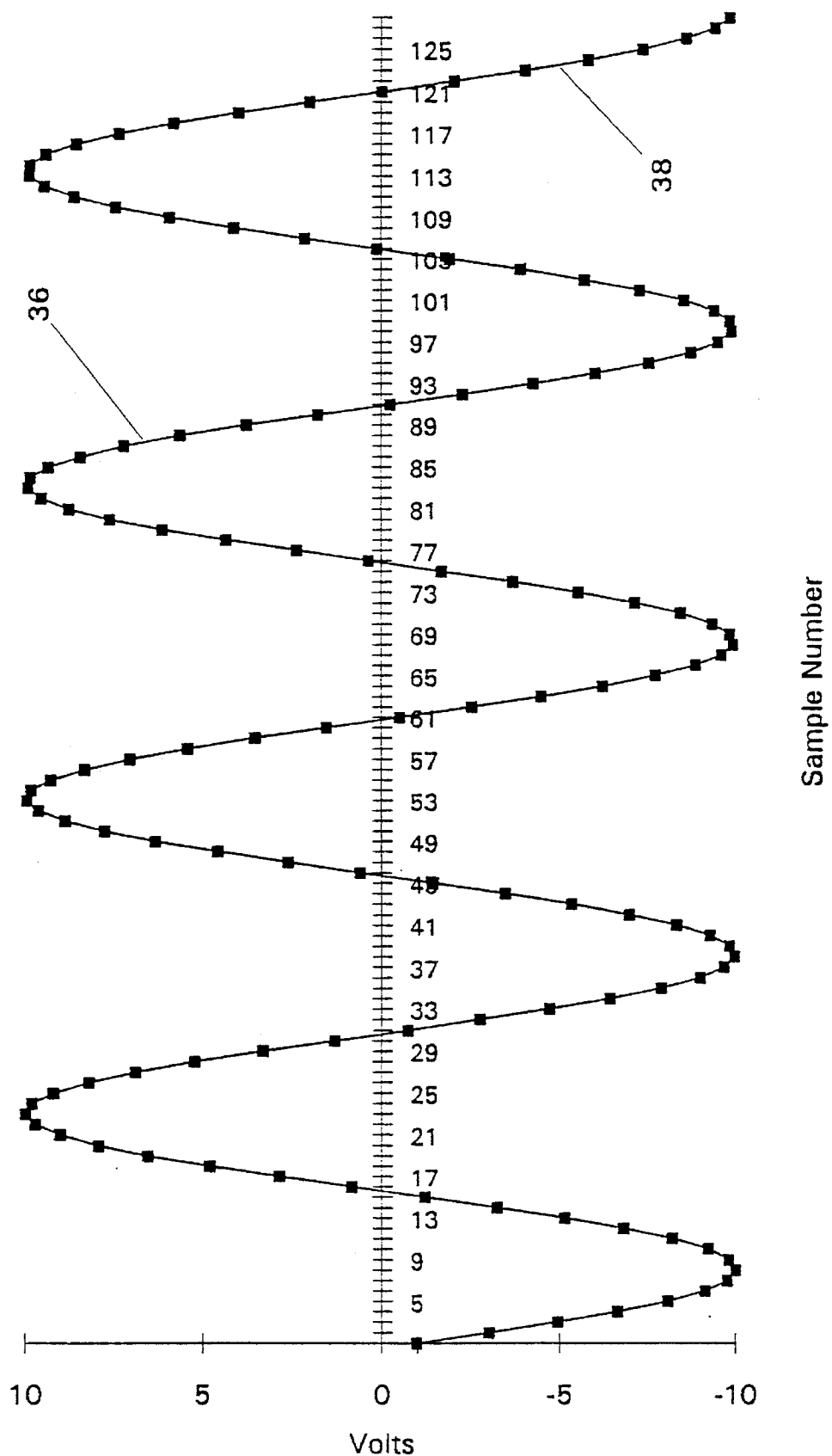
Figure 3D:
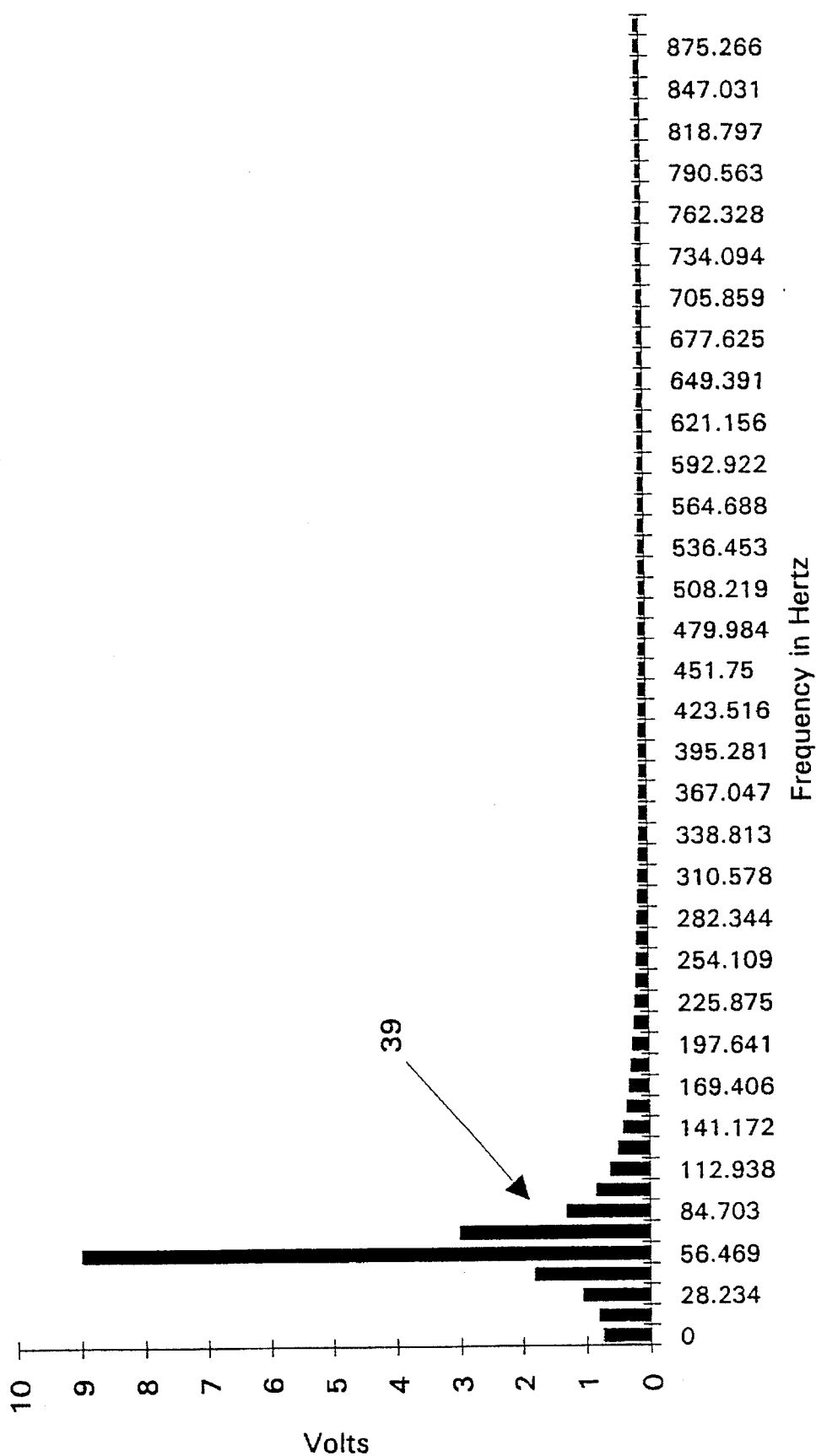

Examples where these two conditions for minimizing dispersion of spectral content are not satisfied are shown in FIGS. 3a through 3d. FIG. 3a is a discrete time-domain data set containing three full cycles of a stationary periodic sinusoidal signal at 30. Zero valued samples 32 were added to complete the data set. FIG. 3b shows the resulting spectra at 34 with no windowing performed. As can be seen in FIG. 3b, the frequency distribution about the sinusoidal frequency is expansive since a discontinuity exists in the discrete time-domain data set. FIG. 3c is a discrete time-domain data set which contains four and ¼ cycles of a stationary periodic sinusoidal signal at 36. Again, a discontinuity exists (at 38) in constructing an infinite duration discrete time-domain signal based on replicas of FIG. 3c. FIG. 3d diagrams the resulting spectra at 39 with no windowing performed and shows the expansive frequency distribution about the sinusoidal frequency as a result of the discontinuity.

These two conditions can be met, and the resulting data set void of discontinuities, by insuring that the sampled data set is full of an exact whole number of carrier wave cycles, assuming the carrier wave is stationary. This solution utilizes the characteristics of the analog motor current signal, which consists of a large sinusoidal carrier signal, as a result of the power source, modulated by small amplitude signals, as a result of the attached mechanical system.

Figure 4A:
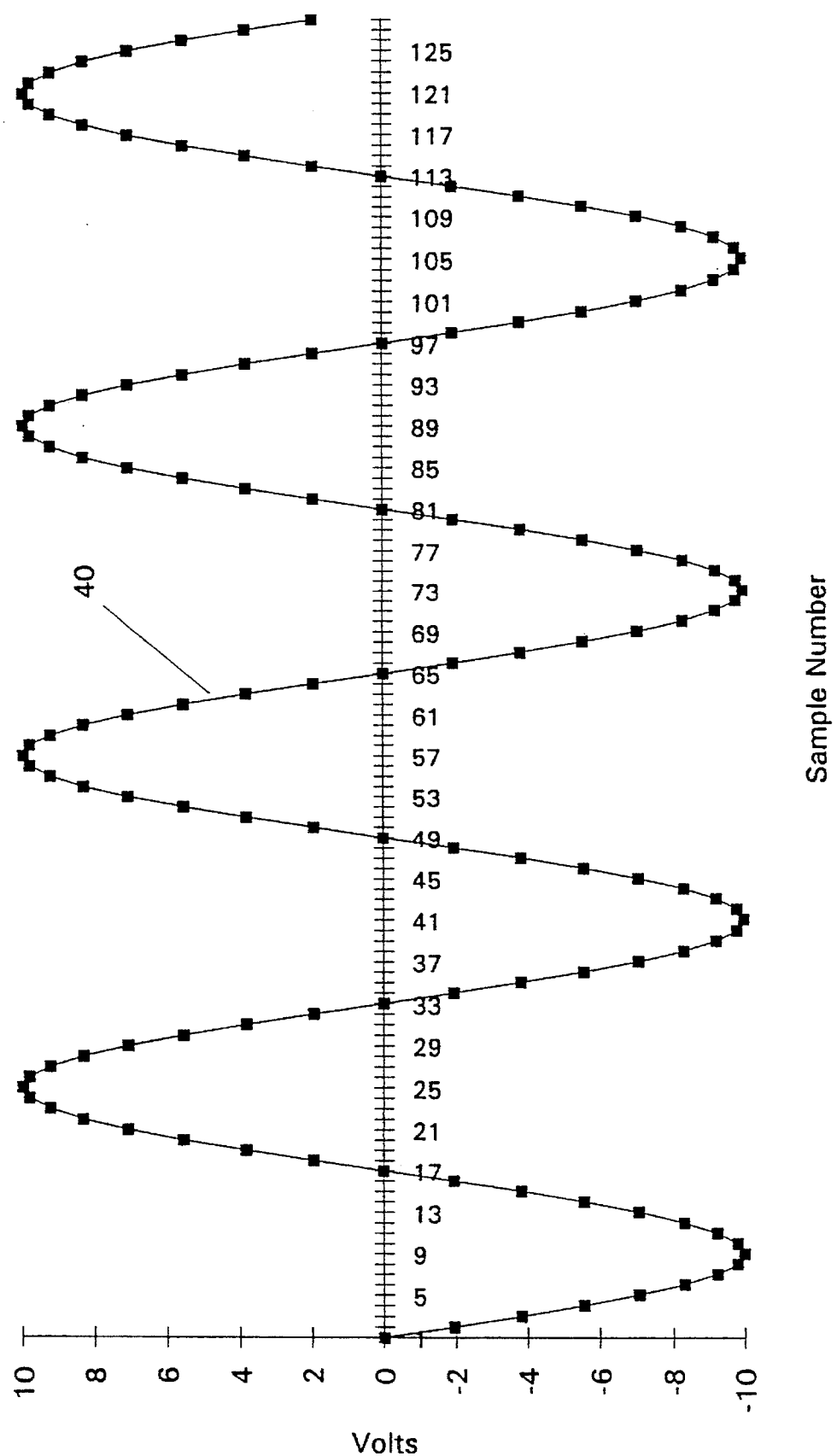
FIGS. 4a and 4c show discrete time-domain data sets containing four and five complete cycles of stationary periodic sinusoidal signals, respectively, as achieved by the present invention.
Figure 4C:
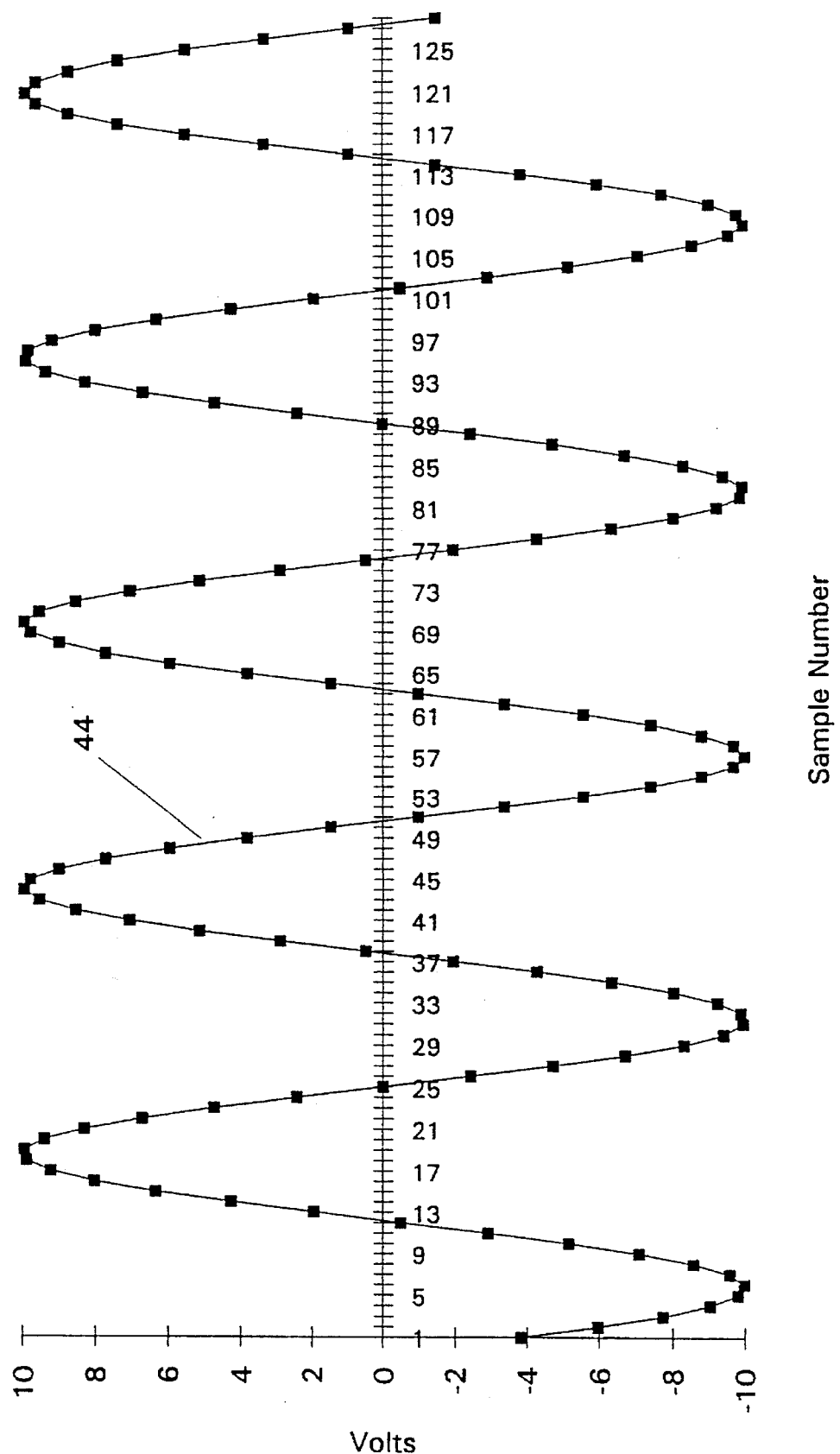

FIGS. 4a through 4d show examples where the discrete time-domain data set is completely filled with an exact whole number of cycles of a stationary periodic sinusoidal signal (as provided for by the present invention). FIGS. 4a and 4c, for example, show discrete time-domain data sets containing four and five complete cycles of stationary periodic sinusoidal signals at 40 and 44, respectively. As seen in FIGS. 4b and 4d, the resulting spectra at 42, 46, generated without applying windowing, have no frequency distribution about the sinusoidal signal since no discontinuities exist in either discrete time-domain data set.

Assuming the analog carrier wave is stationary, a means of creating a sampled data set full of an exact whole number of carrier wave cycles is to insure that the product of the carrier wave frequency and the time duration of the sampled data set equals a whole number. This whole number will be the number of carrier wave cycles in the discrete data set. For example, with a carrier wave frequency of 60 Hz (60 cycles/second) and a sampled data set time duration of 1/60 seconds, the discrete data set will contain one complete carrier wave cycle. Expressed as an equation, $$\text{\# whole carrier wave cycles} = f_{carrier} \times \text{sampled data set time duration} \quad (1)$$

The time duration of the sampled data set is defined as the number of samples in the discrete data set divided by the sampling rate. Therefore, a sampled data set completely filled with a whole number of carrier wave cycles can be created by selecting appropriate values for both the number of samples in the data set and the sampling rate. Expressed as an equation, $$q = (f_{carrier}) \times (\text{\# samples})/f_{samp}, \quad (2)$$

q=# whole carrier wave cycles=1,2,3 . . . R

Figure 5:
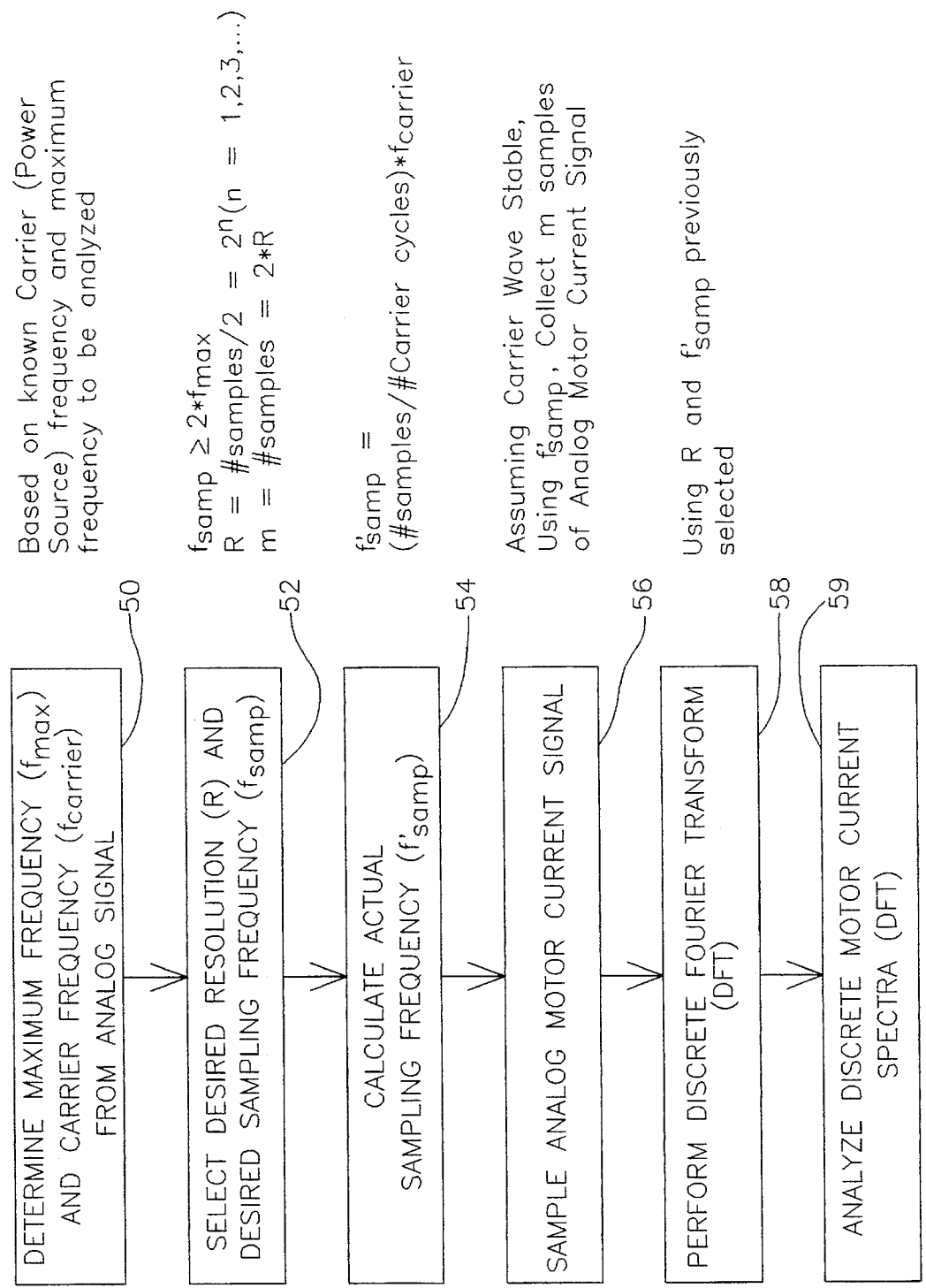
FIG. 5 is a flow diagram of the method of the present invention.

A method to create such as sampled data set is discussed particularly with respect to a flow diagram shown in FIG. 5. First, the carrier frequency ($f_{carrier}$) and the maximum frequency to be processed by the DFT ($f_{max}$) are determined from the analog motor current signal as at 50. Next, the desired DFT resolution (R), and the desired sampling rate ($f_{samp}$) are calculated (at 52) as $$f_{samp} \geq 2 \times f_{max}, \text{ and} \quad (3)$$

$$R = 2^n, \text{ where } n=1,2,3 \ldots \quad (4)$$

As required by the DFT, the resolution (R) of the discrete spectra must be a power of two and the number of samples comprising a discrete data set must be twice the resolution. Expressed as an equation, $$\text{\# samples} = 2 \times R = 2^{n+1}, \text{ where } n=1,2,3 \ldots \quad (5)$$

Next, the actual sampling rate ($f'_{samp}$) is determined (at 54) by rearranging equation (2) so that $$f'_{samp} = (\text{\# samples}) \times (f_{carrier})/(q), \quad (6)$$

where $f'_{samp} \sim f_{samp}$ and q=# whole carrier wave cycles=1,2,3 . . . R

After an appropriate $f'_{samp}$ has been calculated, the analog motor current signal is sampled at the rate $f'_{samp}$ (at 56) to form a sampled data set completely filled with an exact whole number of carrier wave cycles, assuming the analog carrier wave is stationary. Next, this discrete time-domain data set is converted to the discrete frequency-domain via the DFT (at 58), where R and $f'_{samp}$ must be specified in the DFT algorithm prior to performing this conversion. As a final step, the frequency enhanced discrete spectra is analyzed (at 59) to determine the health of the rotating machine.

Several observations concerning equation (6) can be made. First, while the particular value of q (whole number of carrier wave cycles) is unimportant, the fact that it must be a whole number forms a basis for this invention. Second, due to the Niquist criteria, the minimum allowable $f'_{samp}$ cannot be less than twice $f_{carrier}$, since this is assumed to be the lowest frequency to be processed by the DFT. This condition places the upper bound of R on q due to equation (5). Finally, the determination of $f'_{samp}$ from equation (6) will be an iterative process, with # samples and # of whole carrier wave cycles (q) as the variables. In addition, those skilled in the art will recognize that the Nyquist criterion is applicable, i.e. the sampling rate must be at least twice the highest frequency of the data one wishes to analyze.

Figure 6:
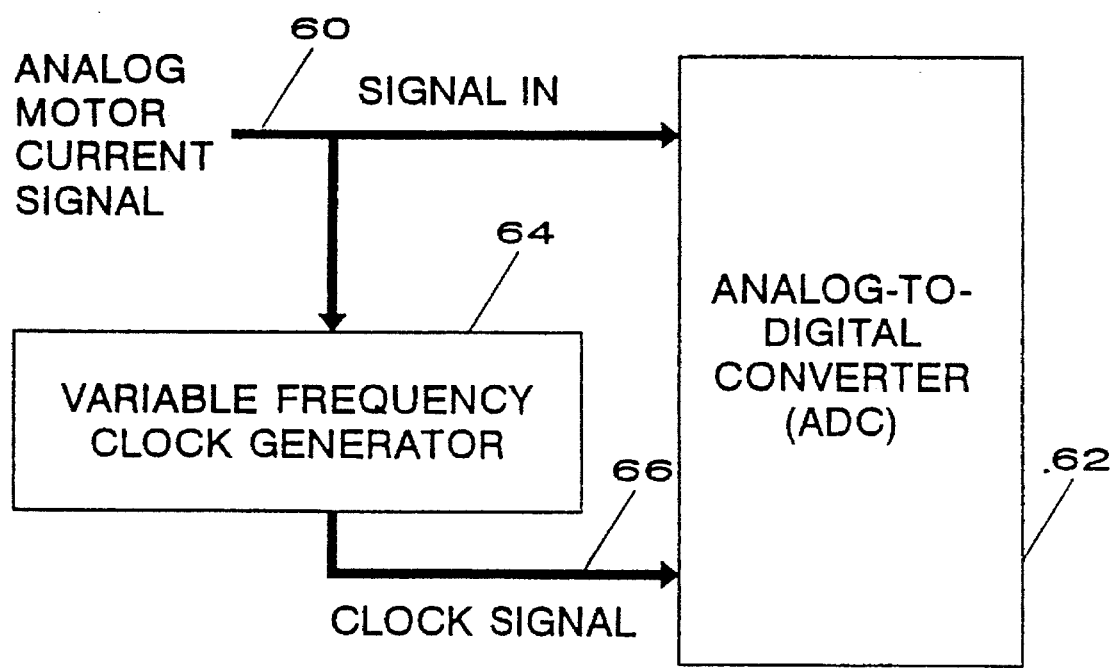
FIG. 6 shows an adjustable frequency clock generator unit which produces a variable sampling rate which adjusts to, and tracks with, the variable carrier wave frequency in accordance with the present invention.

As a practical means of implementing the outlined process, special consideration must be given to the clock generator, whose output frequency is $f'_{samp}$. The above description assumed that the analog signal was stationary. However, as previously discussed, the carrier wave is nonstationary. As a consequence, collecting samples at a fixed frequency, as is traditionally done, will not result in a discrete data set with a whole number of stationary carrier wave cycles. However, by varying the time at which samples are collected by the analog-to-digital converter (ADC) so that the sampling rate adjusts to frequency variations in the nonstationary carrier wave, the nonstationary analog carrier wave can be recreated as a stationary discrete carrier wave. Thus, the sampling rate is dynamically adjusted to the carrier wave frequency. In addition, by varying the sampling rate in this fashion, a discrete data set full of an exact whole number of stationary carrier wave cycles can be created. This variable sampling rate can be implemented with an adjustable frequency clock generator system, as shown in FIG. 6, which adjusts to and tracks with the variable carrier wave frequency. In this system the motor current analog signal (at 60) feeds both an ADC 62 and a variable frequency clock generator 64. This clock generator 64 produces a clock signal (at 66) that varies with any frequency variation in the analog signal. Thus, the ADC is triggered such that it appears that there is no frequency change in the carrier wave.

Figure 7:
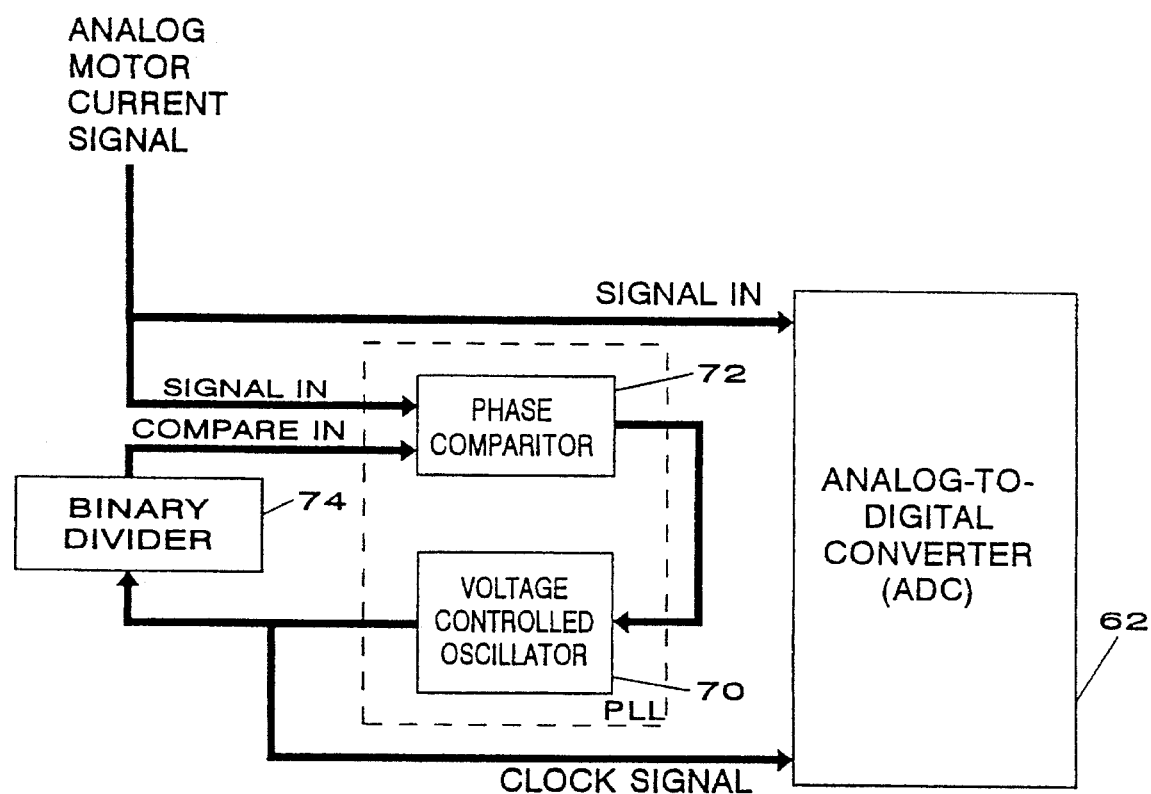
FIG. 7 shows a fundamental phase-locked-loop (PLL) implementation of the adjustable frequency clock generator of FIG. 6.

One means of implementing an adjustable frequency clock generator 64 which adjusts to and tracks with the variable frequency carrier wave is to utilize a phase locked loop (PLL) circuit. Fundamentally, the PLL circuit, shown in FIG. 7, consists of a voltage controlled oscillator (VCO) 70, whose output frequency is tuned with the DC voltage output of a phase comparitor 72. By adjusting the VCO DC input voltage, which is the phase comparitor output, the VCO output frequency will correspondingly adjust. In this invention, the output of the VCO is the clock signal to the ADC 62 (or sampling rate) and is preset in hardware to produce a frequency of $f'_{samp}$, on average. The VCO output is also divided down, with a binary divider 74, to match the average frequency of the carrier wave since the conditioned VCO output and carrier signals, which are the inputs to the phase comparitor 72, must maintain approximately the same frequency for the phase comparitor to operate properly. The phase relationship of the divided VCO output and the carrier wave is then correlated every carrier wave cycle by the phase comparitor. When a phase difference is detected by the phase comparitor 72, its DC output voltage will correspondingly adjust, which in turn causes the VCO to alter its output frequency. In this manner, the sampling rate, or VCO output, adjusts with the variable frequency carrier wave so that a discrete data set with stationary carrier wave cycles can be recreated from an analog motor current signal with a nonstationary carrier.

The use of the PLL as a practical means of implementing the sampling process imposes additional constraints on equation (6). Since the VCO output is $f'_{samp}$, and one of the two inputs to the phase comparitor is $f_{carrier}$, the divider circuit is, in reality, the ratio of the number of samples in the discrete data set divided by the number of whole carrier wave cycles in the discrete data set, as stated in equation (6). Since the divider is a binary digital circuit, it can only perform divisions equal to a power of two so that equation (6) becomes $$f'_{samp} = 2^n \times (f_{carrier}), \text{ where} \quad (7)$$

$f_{samp} \sim f'_{samp}$ and $n=1,2,3,\ldots$

Several statements can be made as a consequence of utilizing a PLL to implement the adjustable frequency clock generator, and as a result of equation (7). First, as a consequence of using a binary divider circuit, $2^n$ samples are collected for each carrier wave cycle and the sampled data set consists of $2^n$ complete carrier wave cycles. Second, the PLL does not condition the motor current signal for input to the ADC. The only conditioning performed on the analog signal is low pass filtering, as required by the Niquist criterion. However, the sampling rate, which conventionally is a fixed frequency, is conditioned in the present invention by the PLL so that it adjusts to the frequency variations of the nonstationary analog carrier wave. This is referred to as "dynamically adjusting" since the adjustment is continuously made to the sampling rate.

Figure 8:
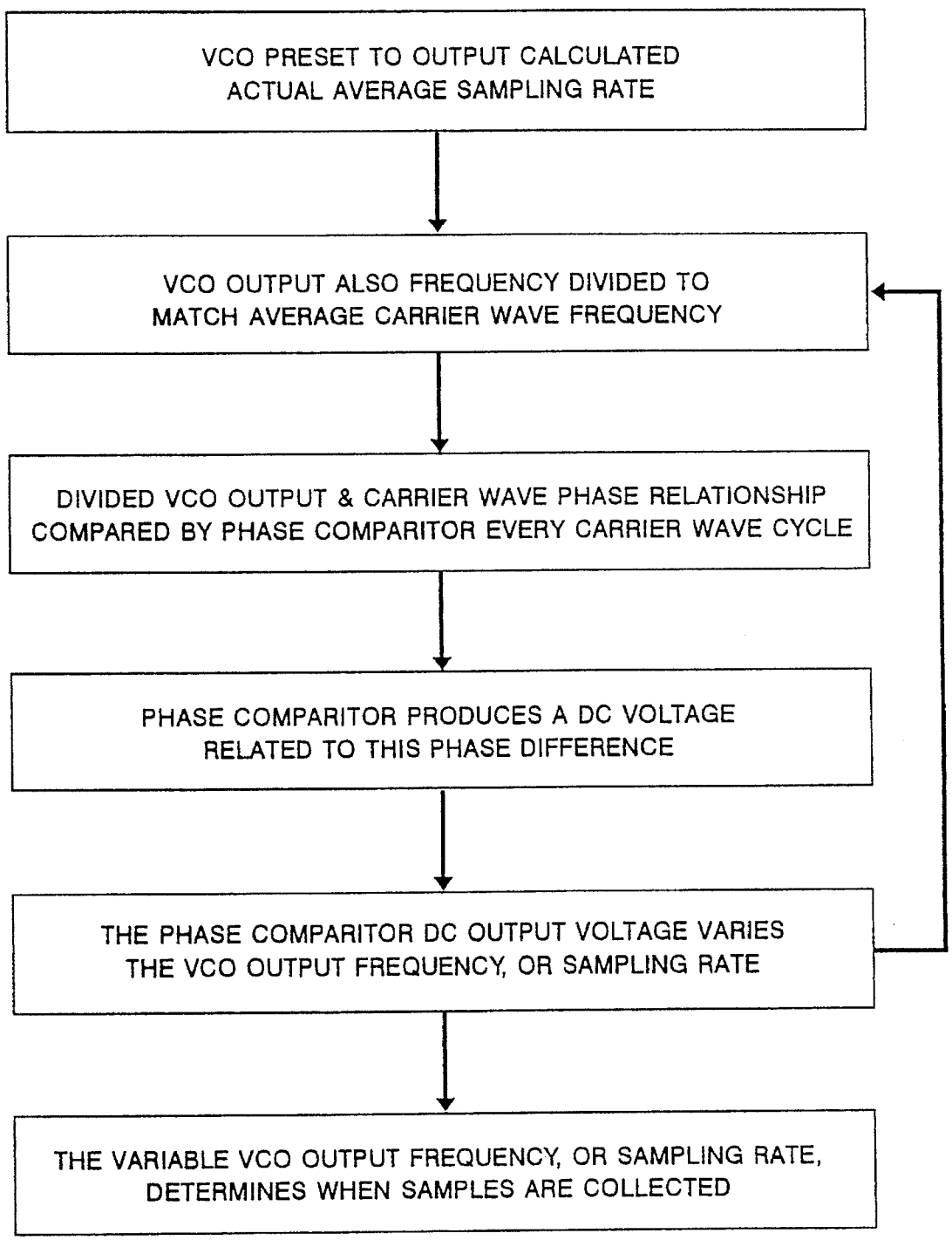
FIG. 8 shows the process flow of the basic PLL implementation of the adjustable frequency clock generator.

The process flow of the basic PLL implementation of the adjustable frequency clock generator is diagramed in FIG. 8. The steps in this flow diagram set forth the operation of the circuit of FIG. 7.

A preferred implementation is presented in this invention to analyze a typical current signal from an electric motor system driven directly from an AC power source. Using the invention method outlined in FIG. 11, a maximum frequency, $f_{max}$, to be analyzed in the discrete spectra is selected to be 1 KHz, and the average carrier frequency, $f_{carrier}$, is primarily 60 Hz as determined by the AC power source. The desired sampling rate, $f_{samp}$, which must be at least twice $f_{max}$ to avoid aliasing in the discrete spectra, is selected to be 2 Khz. Next, the desired DFT resolution, R, is chosen to be 2048 lines in the discrete spectra so that discrete frequencies can be resolved down to approximately 0.5 Hz. As a result, 4096 samples must be collected for a given sampled data set since the DFT requires twice the number of samples collected for a given discrete spectral resolution for real data. An actual sampling rate, $f'_{samp}$, close in frequency to the desired sampling rate, $f_{samp}$, is then calculated from Equation 6, where this calculation is an iterative process with the number of whole carrier wave cycles, q, as the variable. For this implementation, a q of 128 was chosen so that $f'_{samp}$ equals 1920 Hz, which is relatively close to the desired sampling rate of 2 Khz. As a result, the maximum frequency which can be analyzed in the discrete spectra is 960 Hz, which is relatively close to the desired maximum frequency of 1 Khz.

Once the appropriate average actual sampling rate, $f'_{samp}$, has been calculated, samples of motor current data must be collected at a rate which varies with the frequency fluctuations of the nonstationary carrier wave so that a discrete time-domain data set containing stationary carrier waves can be created. As stated above, the variable rate sampling frequency is produced by a variable frequency clock generator implemented using a PLL, which is configured to produce the average sampling frequency, $f'_{samp}$, of 1920 Hz.

Figure 9:
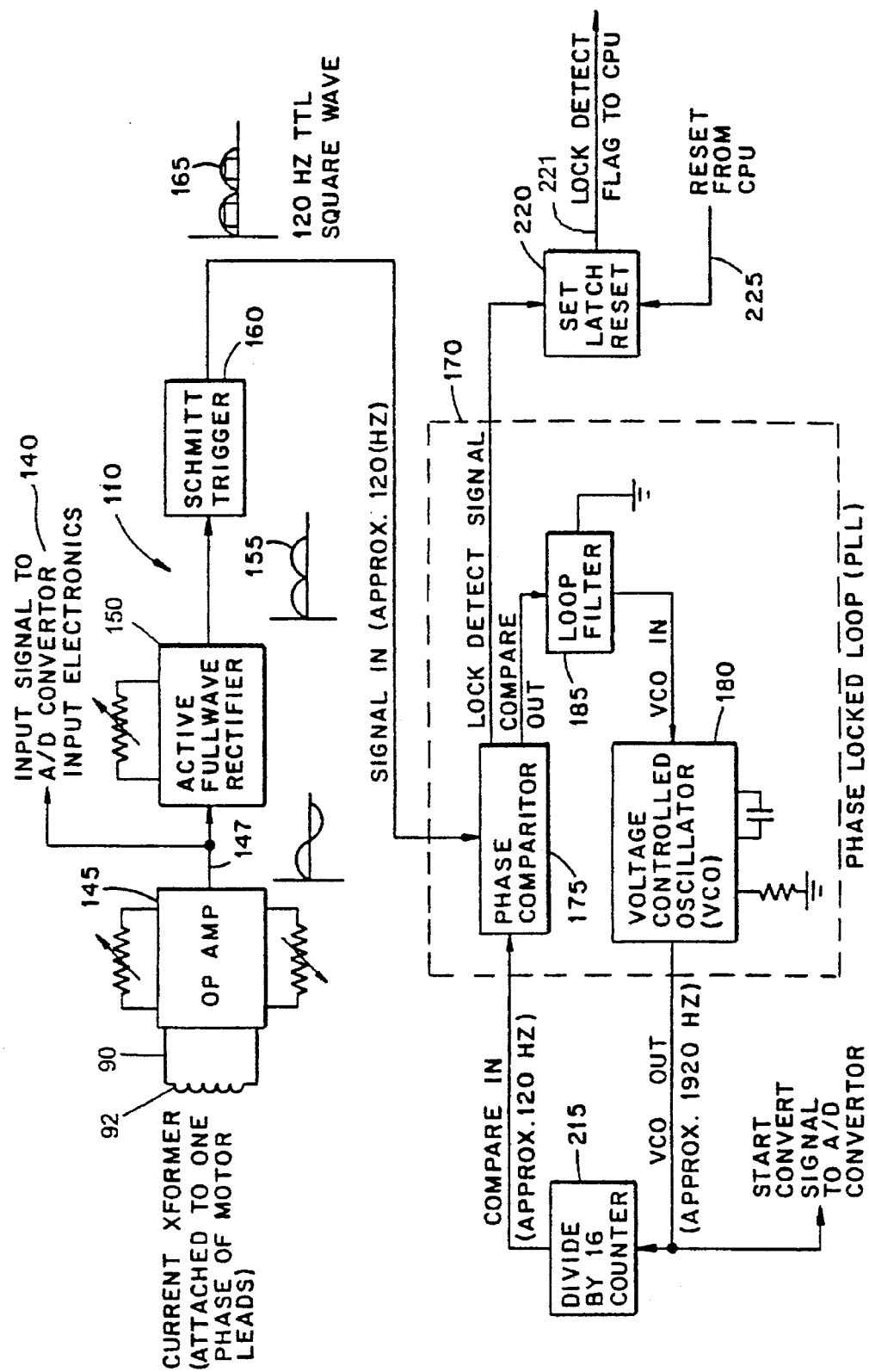
FIG. 9 is a block diagram of the preferred embodiment of an electrical circuit for implementing the present invention.
Figure 10:
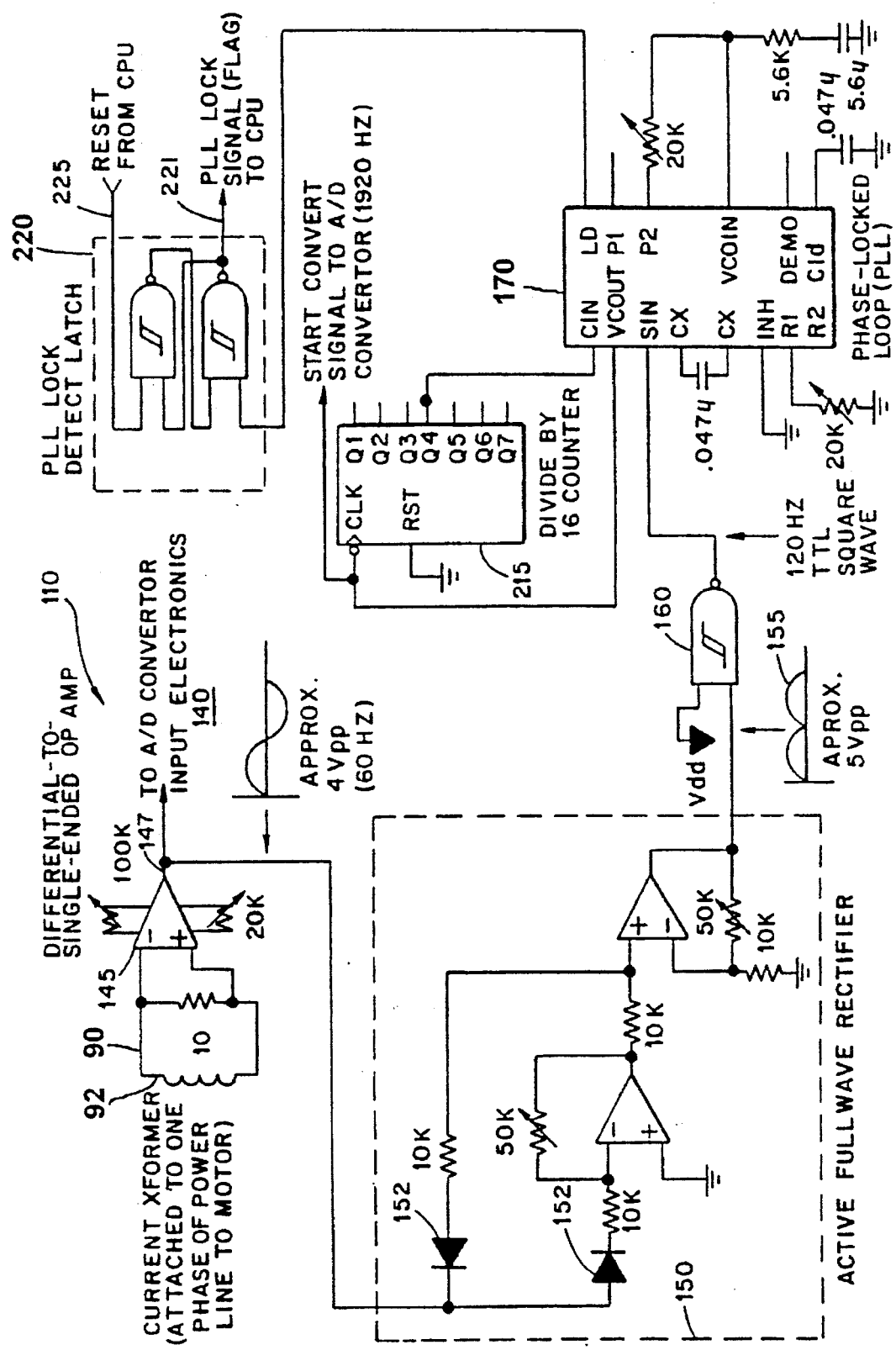
FIG. 10 is a schematic drawing of the preferred embodiment of the electrical circuit illustrated in FIG. 9.

A preferred sampling apparatus, and associated waveforms, are illustrated in FIG. 9 combined with FIG. 10, and consists of electronic hardware 110 that determines when samples of motor current data are acquired. The differential signal 90 current transformer 92 is converted to a single-ended signal via the differential operational amplifier (op amp) 145. The output 147 of this op amp 145 is used as the input to both the ADC signal conditioning electronics 140 and the first stage 150 (see FIG. 10) of the PLL implementation of the adjustable frequency clock generator. The VCO 180 is preset to output an average frequency of 1920 Hz, which is $2^5$ multiplied by the 60 Hz average carrier wave frequency, yielding 32 samples for each carrier wave cycle. The phase comparitor 175 output is filtered at loop filter 185 prior to becoming the VCO input to insure stability and responsiveness. The ability of the comparitor 175 to respond to its inputs accurately depends on the design of the loop filter 185. A lead-lag filter was chosen since it provided the fastest and most stable response.

In addition, the PLL circuit 170 is configured to maximize its ability to track the variation in frequency of the carrier wave. If the time variation between samples is too great, the sampled signal will not be faithfully replicated and illegitimate frequency content can result in the discrete frequency-domain. To improve the tracking ability of the PLL, and reduce the variation in time between samples, both the carrier wave and the VCO output are conditioned from within the adjustable frequency clock generator. The carrier wave is conditioned with a full wave rectifier 150 to effectively doubled its frequency (120 Hz), and a Schmitt trigger 160 to convert it to a transistor-to-transistor (TTL) signal. In addition, the 1920 Hz VCO output is divided down (divide by 16 counter 215) to a 120 Hz TTL signal, which represents a division of 16 or 24. The resulting inputs to the phase comparitor are now both 120 Hz signals on average and can be directly correlated.

The significance of doubling the frequency of the carrier wave input to the phase comparitor is that the precision of the adjustable frequency clock generator is enhanced. Normally, the phase comparitor would perform a new comparison, adjusting its output and causing a corresponding change in the VCO output frequency, every carrier wave cycle. By doubling the frequency of the carrier wave, the comparitor is forced to compare the phase relationship of its inputs twice as often for every sampled data set since a new comparison will occur every half cycle of the carrier wave. As a result, the time variation between samples in the discrete data set is minimized and the analog signal is more faithfully replicated in the discrete time-domain.

In the preferred embodiment, sampling circuitry requires that the line frequency does not vary more than ten Hz. However, if the line frequency fluctuates beyond the operating range of the PLL circuit, the PLL will become unstable, resulting in a nonstationary sampled carrier wave. To warn the operator when this condition occurs, a lock detect latch 220 was added to provide an "error" signal. The output of this flip-flop becomes active when PLL 170 is out of lock. Once triggered, the latch output 221 will remain active until cleared via the reset line 225.

As previously stated, the first stage 150 of the preferred apparatus actively rectifies the incoming AC signal to improve the locking ability of the PLL. By effectively doubling the line frequency with this rectifier, the PLL is forced to track twice as often, thus the sampling rate is adjusted every half cycle of the carrier. However, this circuit requires special consideration to insure symmetry of its output signal. Two matched diodes 152 in this stage are utilized to produce a symmetric intermediate wave-form 155. In addition, both the symmetry and level of the output wave-form of this stage are adjusted with two variable resistors. While an absolute operator circuit could have been employed, this active rectifier design was chosen since it produces a more symmetric output for sinusoidal inputs.

Also as previously stated, the Schmitt trigger stage 160 then converts the rectified signal into a TTL square wave 165 (see FIG. 9) with a frequency twice that of the carrier. The symmetry of its output is determined solely by the active rectifier circuit output. While several different digital gates could have been chosen, the Schmitt trigger 160 was selected due to its capability of increasing noise immunity.

The circuitry 110 is designed around a line frequency of 60 Hz which is standard alternating current line frequency in the United States. It will be recognized by those skilled in the art that in countries where other line frequencies are standard, fine tuning components may require adjustment.

Figure 11:
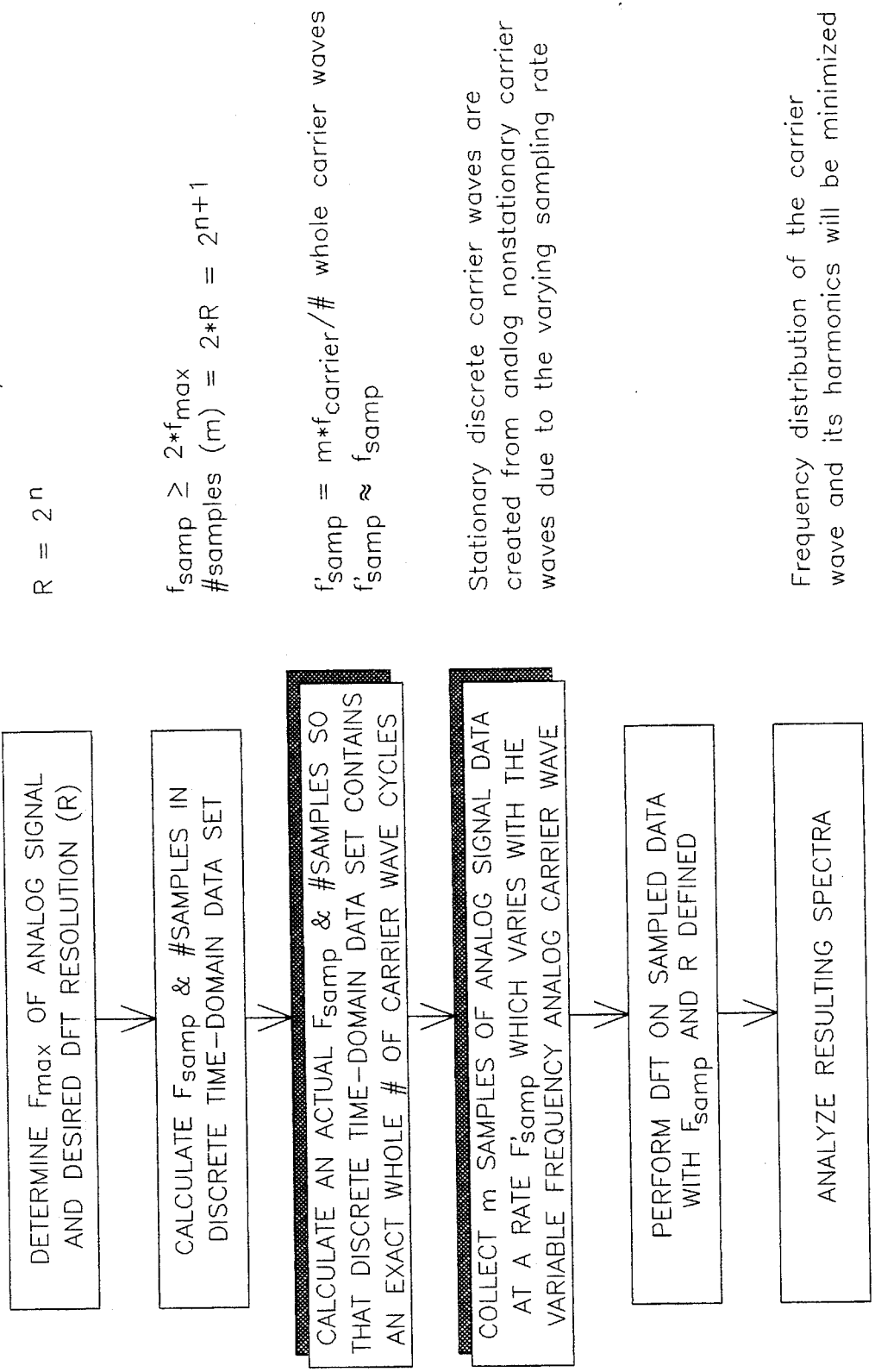
FIG. 11 shows a diagram depicting the process comprising both the invention method and circuitry. Those steps unique to this invention are highlighted for ease in comparison with FIG. 2.
Figure 12A:
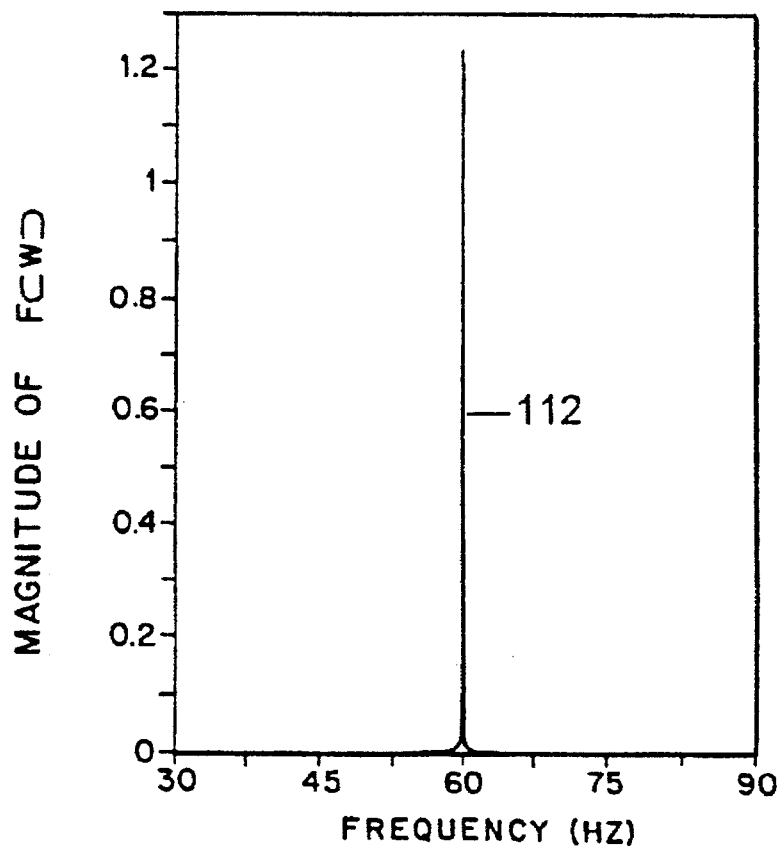
FIGS. 12a and 12b are the spectra of an amplitude modulated (AM) signal sampled by the prior art method, whose stationary carrier and modulator are a large 5 $V_{pp}$ (Volt peak-to-peak) 60 Hz and a small 20 $mV_{pp}$ (millivolt peak-to-peak) 55 Hz sine-wave, respectively.
Figure 12B:
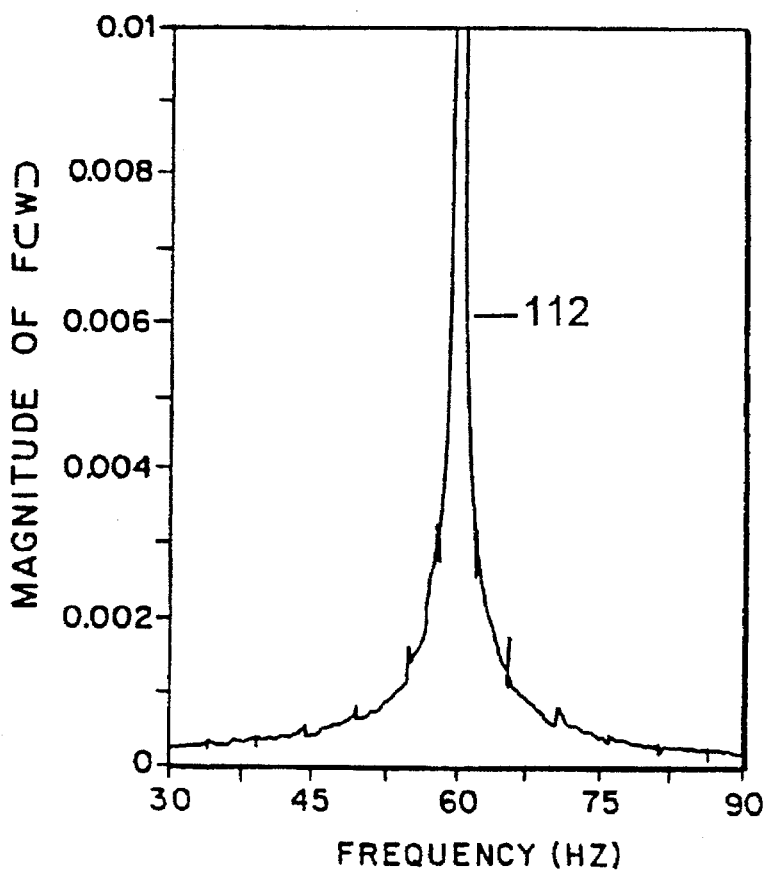
Figure 13A:
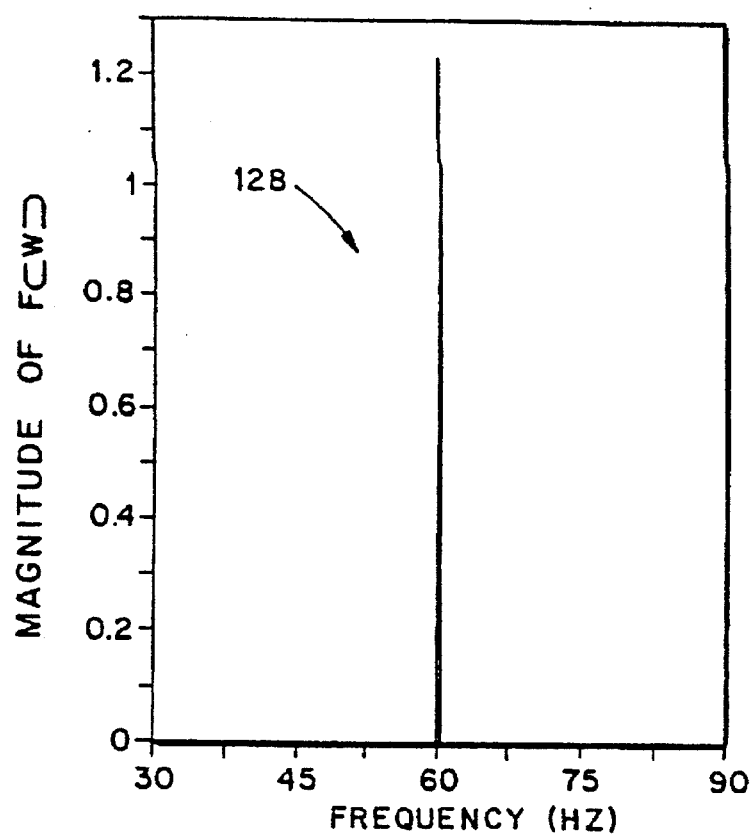
FIGS. 13a and 13b are the spectra of an AM signal sampled in accordance with the present invention, whose stationary carrier and modulator are a large 5 $V_{pp}$ 60 Hz and a small 20 $mV_{pp}$ 55 Hz sine-wave, respectively.
Figure 13B:
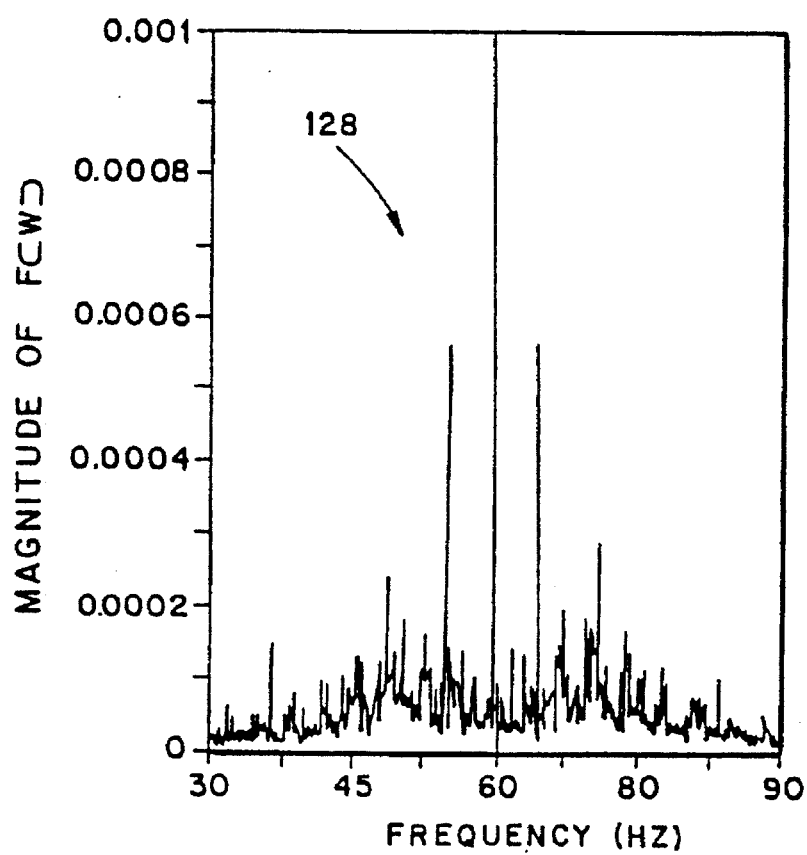

A diagram depicting the process comprising both the invention method and circuitry is shown in FIG. 11. Those steps unique to this invention are highlighted for ease in comparison with FIG. 2. Specifically, the important distinctions are:

1) establishing a discrete time-domain data set that contains an exact whole number of carrier wave cycles; and 2) collecting samples at a sampling rate that varies with any variation of frequency in the analog carrier wave, i.e., the sampling rate is dynamically adjusted according to any such variation.

Figure 14A:
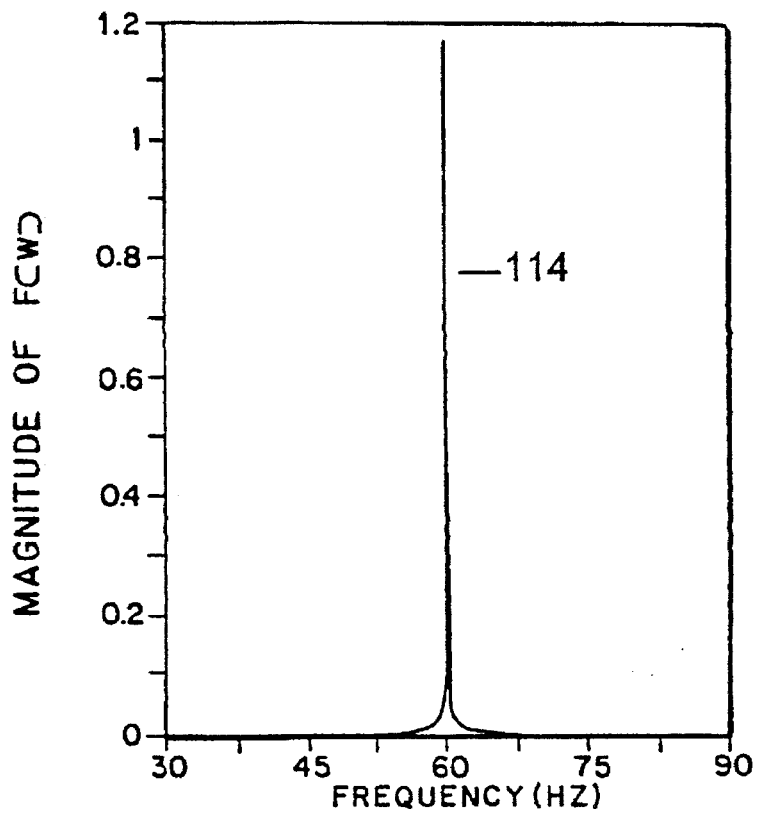
FIGS. 14a and 14b are the spectra of an AM signal sampled by the prior art method, whose stationary carrier and modulator are a large 5 $V_{pp}$ 60 Hz and a small 20 $mV_{pp}$ 58 Hz sine-wave, respectively.
Figure 14B:
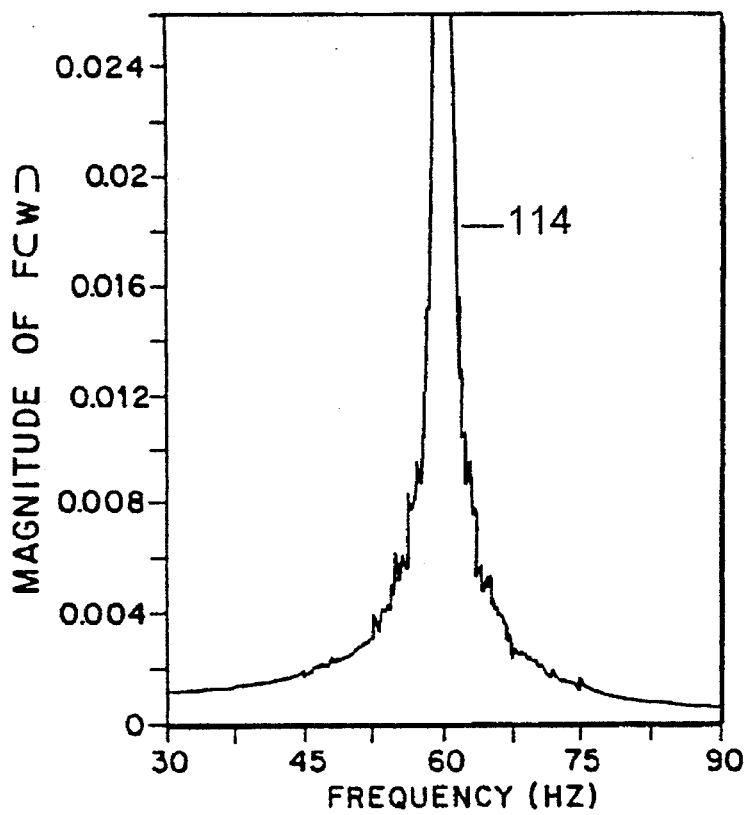
Figure 15A:
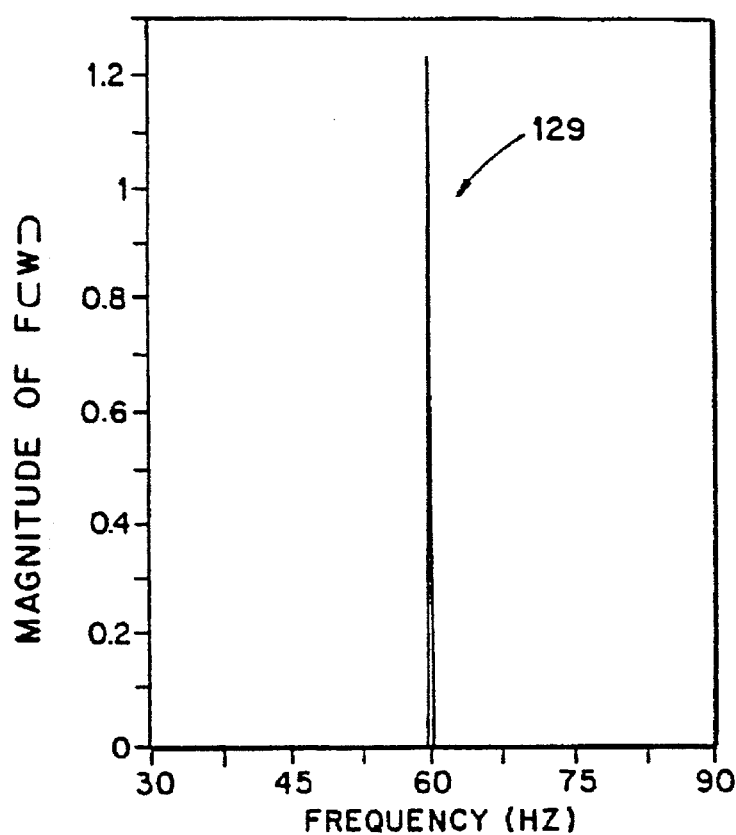
FIGS. 15a and 15b are the spectra of an AM signal sampled in accordance with the present invention, whose stationary carrier and modulator are a large 5 $V_{pp}$ 60 Hz and a small 20 $mV_{pp}$ 58 Hz sine-wave, respectively.
Figure 15B:
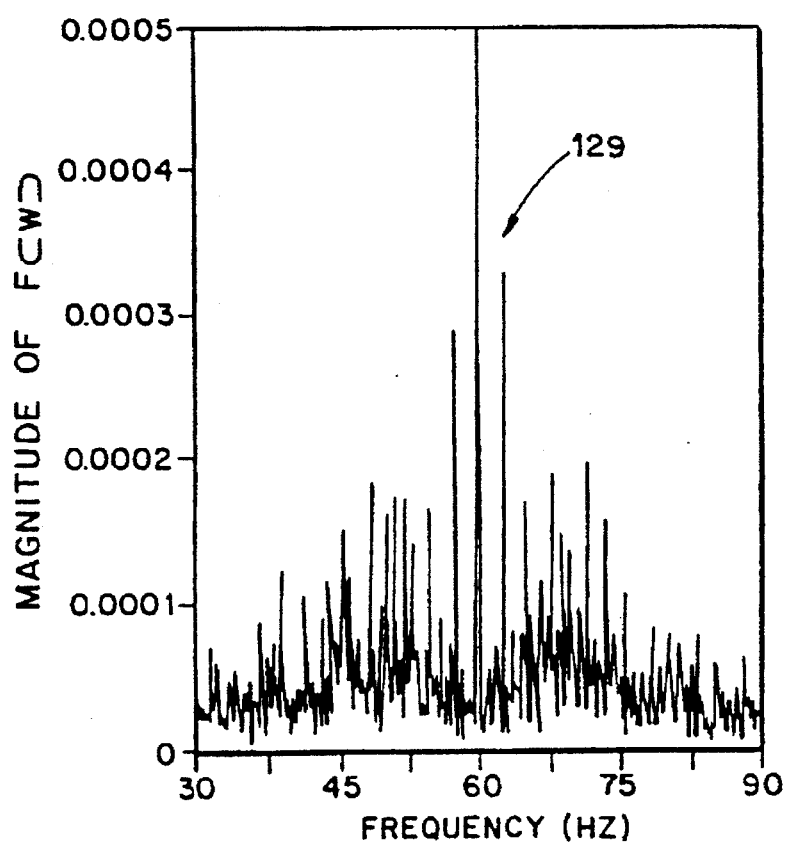

To prove the integrity of the method of the present invention, an amplitude modulated, 5 volt peak-to-peak 60 Hertz (Hz) stationary sinusoidal signal was analyzed using both sampling methods. In all cases, a small 20 millivolt, sinusoidal signal was utilized as the modulator, this being typical of the type of perturbations experienced in motor currents. In addition, the sampling rate was chosen to be 1920 Hz ($2^5$ times the 60 Hz line frequency). FIGS. 12a and 12b, 14a and 14b, and 16a and 16b show the spectra 112, 114, and 116, respectively, obtained when the respective signals are sampled in accordance with the prior art. FIGS. 13a and 13b, 15a and 15b, and 17a and 17b show the spectra, 128, 129 and 130, respectively, obtained when the respective signals are sampled in accordance with the present invention. FIGS. 12a, 12b and 13a, 13b show the spectra for the above case with the modulating frequency set to approximately 55 Hz. Comparing FIG. 13b to FIG. 12b, the spread of the 60 Hz component is reduced. Similar data were analyzed with the modulating frequency, set to approximately 58 Hz as seen in FIGS. 14a, 14b and 15a, 15b. Again, the modulating frequency is more discernable, as seen in FIG. 15b, than is the modulating frequency when analyzed using conventional sampling methods, as is seen in FIG. 14b. As the frequencies of the signals of interest become closer to that of the carrier, the advantages of this sampling method become even more apparent.

In the above cases, the analog carrier wave developed by a signal generator is stationary. As a result, sampling at a fixed rate determined by the invention method is all that is required to insure that the discrete time-domain data set is completely filled with an exact whole number of sinusoidal signal cycles. In actual motor current signals, however, the carrier wave is nonstationary due to the nonideal power source. In that case, the sampling rate must vary with the frequency variations of the carrier wave to reconstruct a discrete time-domain data set with stationary carrier wave cycles. For simplification, though, the previous cases utilizing the invention method also utilized the adjustable frequency clock generator of the invention circuitry, implemented with a PLL.

As a test of the present invention on rotating equipment, data was collected from a small single-phase fan motor using both sampling methods. The spectra of these data are shown in FIGS. 16a and 16b and 17a and 17b, respectively. Since in this case the input analog signal is the actual motor current, it contains a nonstationary carrier wave component due to the nonideal power source. As a result, the adjustable frequency clock generator, implemented with a PLL, is necessary to insure that the discrete time-domain data set is recreated with stationary carrier wave cycles by sampling at a variable rate related to the frequency variations of the carrier wave. The combination of using an adjustable frequency clock generator and sampling only at rates consistent with the invention method will insure that the discrete time-domain data set is completely filled with an exact whole number of stationary carrier wave cycles. As a result, the frequency distribution of those components due to the carrier wave and its harmonics is minimized in the discrete spectra so that the motor current signals of interest are more easily discerned.

Figure 16A:
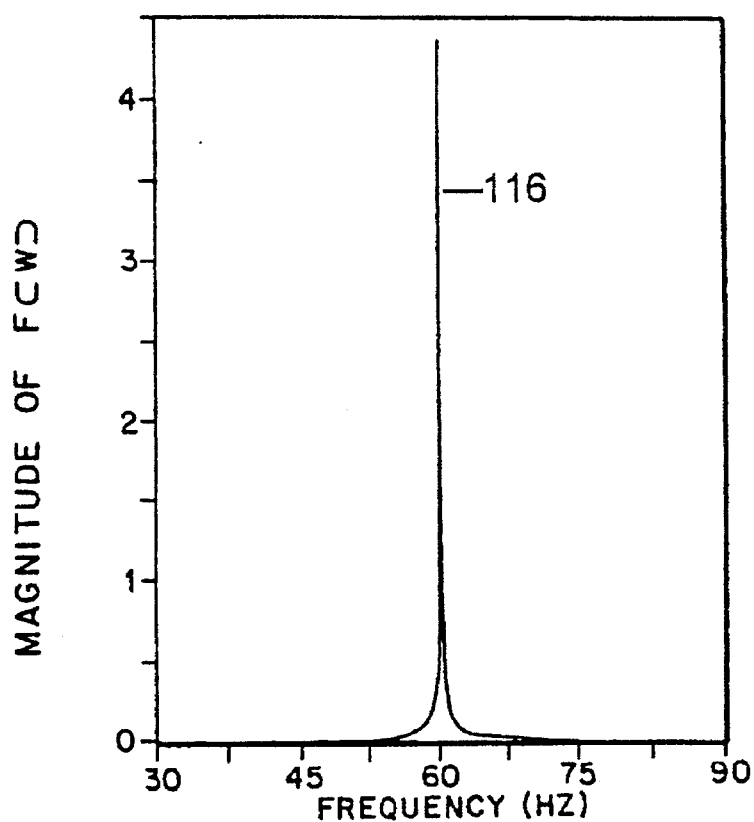
FIGS. 16a and 16b are the spectra of an AM signal produced by a single-phase fan motor sampled by the prior art method. The actual motor current signal used to produce the spectra of FIGS. 16a and 16b is comprised of a large nonstationary carrier with small AM modulations.
Figure 16B:
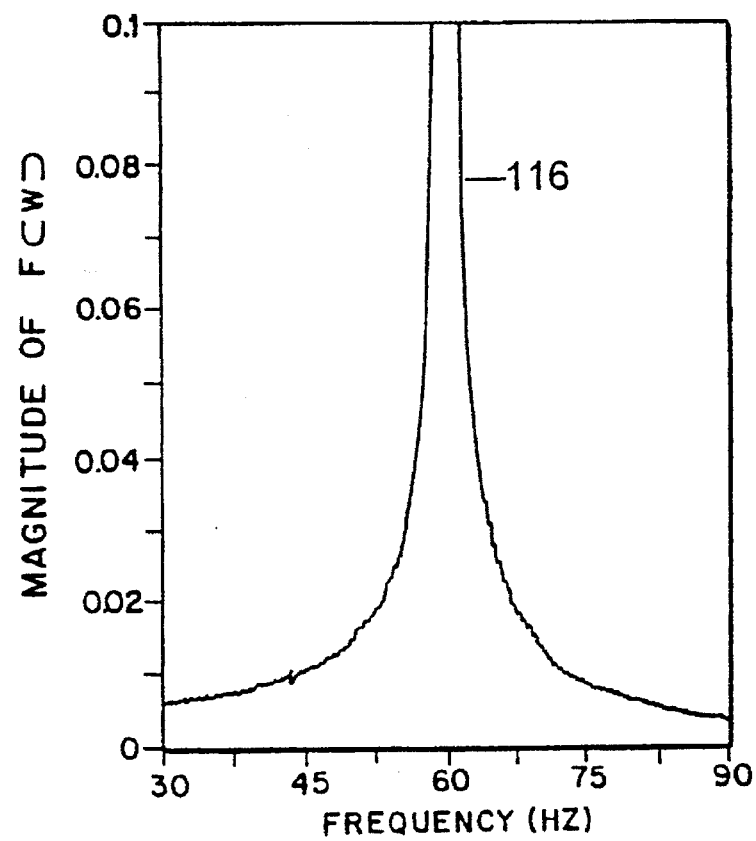
Figure 17A:
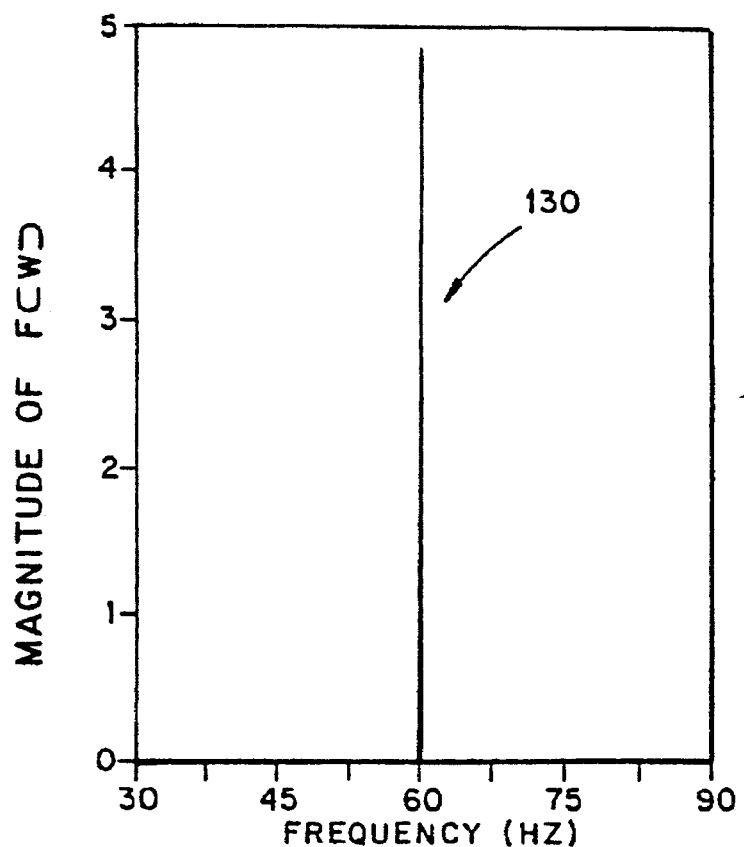
FIGS. 17a and 17b are the spectra of an AM signal produced by a single-phase fan motor sampled in accordance with the present invention. Again, the actual motor current signal used to produce the spectra of FIGS. 16a and 16b is comprised of a large nonstationary carrier with small AM modulations.
Figure 17B:
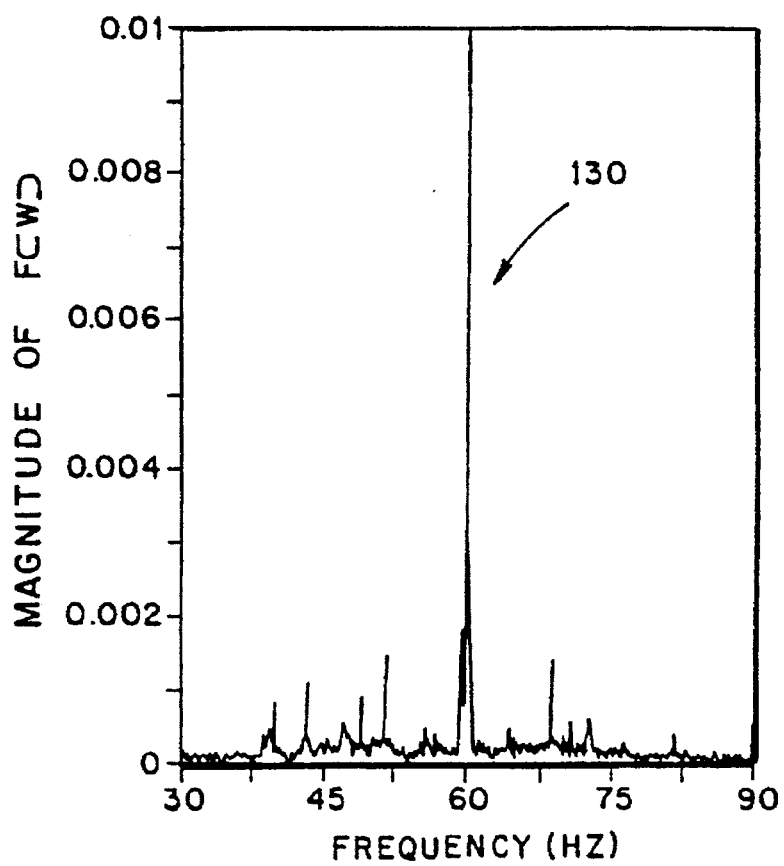

An increased resolution was achieved in FIG. 17b over FIG. 16b in two ways. First, since this sampling method and circuitry reduced the Gaussian distribution of the large line frequency component, a separation of the 60 Hz component and nearby data of interest resulted. Second, due to the reduced spread of the line frequency component and its harmonics, the spectral content around that frequency can be enlarged to a greater extent, aiding in spectral analysis.

From the foregoing description, it will be recognized by those skilled in the art that a method for sampling periodic amplitude modulations carried by a nonstationary periodic carrier wave has been provided that offers advantages over the prior art. Specifically, the method enhances the ability to detect minor amplitude modulations, such as periodic time waves induced by rotating equipment, in a nonstationary periodic carrier wave of standard alternating current for improved motor current signature analysis. The present invention further provides a method and circuitry that will increase the frequency resolution of motor current spectra by sampling the motor current data in such a way that a sampled data set for input to the DFT contains an exact whole number of stationary carrier wave cycles, thereby minimizing those spectral components due to the carrier wave and its harmonics.

While a preferred embodiment has been shown and described, it will be understood that it is not intended to limit the disclosure, but rather it is intended to cover all modifications and alternate methods falling within the spirit and the scope of the invention as defined in the appended claims or their equivalents.

We claim:

1. A method for motor current signature analysis to determine frequencies in perturbations within the current, the current having a sinusoidal nonstationary carrier wave frequency, said method comprising the steps:

deriving an analog signal related to said current having the non-stationary carrier wave containing the perturbations;

selecting a resolution value, R, for analysis of a discrete data set;

selecting a desired sampling rate, $f_{samp}$, that is at least twice a maximum frequency to be analyzed in said frequencies in said perturbations;

calculating an actual sampling rate, $f'_{samp}$, that is close to said desired sampling rate, said actual sampling rate being equal to a product of the carrier wave frequency, $f_{carrier}$, multiplied by a selected number of samples, m, divided by a selected number of cycles of the carrier wave, where the number of cycles is a whole number;

producing from said actual sampling rate, $f'_{samp}$, a dynamically adjusted sampling rate which varies according to frequency variations in the nonstationary carrier wave;

sampling said analog signal said selected number of times, m, at said dynamically adjusted sampling rate to create said discrete data set containing a stationary carrier wave form having said exact whole number of cycles;

performing Discrete Fourier Transform of said discrete data set at said selected resolution value, R, and said dynamically adjusted sampling rate and analyzing a result of said Discrete Fourier Transform of said discrete data set for frequencies of the perturbations.

2. The method of claim 1 wherein said step of deriving said analog signal is achieved by inserting a differential transformer in a current lead to the motor, with an output of said differential transformer providing said analog signal having the non-stationary carrier wave frequency containing the perturbations.

3. The method of claim 1 wherein said step of producing said adjusted sampling rate according to changes in frequency of the carrier wave is achieved by inputting said analog signal into both an analog-to-digital converter and a variable frequency clock generator, with an output clock signal from said clock generator triggering collection of samples of said analog signal by said analog-to-digital converter.

4. The method of claim 1 wherein said step of producing said adjusted sampling rate according to changes in frequency of the carrier wave is achieved by inputting said analog signal into both an analog-to-digital convertor and a phase comparitor, a dc output of said phase comparitor feeding an input to a voltage controlled oscillator preset to a selected frequency, with an output of said voltage controlled oscillator both triggering operation of said analog-to-digital convertor and inputting to said phase comparitor, whereby detection of a phase difference, due to frequency changes in said carrier wave, by said phase comparitor causes said dc output of said phase comparitor to change accordingly thereby causing said output of said voltage controlled oscillator to change frequency for triggering collection of said samples of said analog signal by said analog-to-digital converter.

5. The method of claim 4 wherein said preset frequency of said voltage controlled oscillator is said sampling frequency, $f'_{samp}$, wherein said analog signal is primarily 60 Hz and is conditioned with a full wave rectifier and a Schmitt trigger to produce a square wave signal of 120 Hz to said phase comparitor, and wherein said output of said voltage controlled oscillator is divided to achieve said 120 Hz for inputting to said phase comparitor.

6. The method of claim 4 further comprising the step monitoring said output of said phase comparitor for instabilities of said voltage controlled oscillator due to extreme fluctuations of frequency of the carrier wave, and providing an output error signal when said instabilities are determined.

7. A method for motor current signature analysis to determine frequencies in perturbations within the current, the current having a sinusoidal nonstationary carrier wave, said method comprising the steps:

deriving, with a differential transformer inserted into a lead to the motor, an analog signal related to said current having the non-stationary carrier wave containing the perturbations;

selecting a resolution value, R, for analysis of a discrete data set;

selecting a desired sampling rate, $f_{samp}$, that is at least twice a maximum frequency to be analyzed in said frequencies in said perturbations;

calculating an actual sampling rate, $f'_{samp}$, close to said desired sampling rate, $f_{samp}$, said actual sampling rate, $f'_{samp}$, being equal to a product of the carrier wave frequency, $f_{carrier}$, multiplied by a selected number of samples, m, divided by a selected number of cycles of the carrier wave, where the number of cycles is a whole number;

producing from said actual sampling rate, $f'_{samp}$, a dynamically adjusted sampling rate which varies according to frequency variations in the nonstationary carrier wave, said dynamically adjusted sampling rate achieved by inputting said analog signal into both an analog-to-digital converter and a variable frequency clock generator, with an output clock signal from said clock generator triggering collection of samples of said analog signal by said analog-to-digital converter according to variations in frequency of the carrier wave;

sampling said analog signal said selected number of times, m, at said dynamically adjusted sampling rate to create said discrete data set containing a stationary carrier wave form having said exact whole number of cycles;

performing Discrete Fourier Transform of said discrete data set at said selected resolution value, R, and said dynamically adjusted sampling rate; and analyzing a result of said Discrete Fourier Transform of said discrete data set for frequencies of the perturbations.

8. The method of claim 7 wherein said inputting into a clock generator comprises inputting of said analog signal into a phase comparitor, a dc output of said phase comparitor feeding an input to a voltage controlled oscillator preset to a selected frequency, with an output of said voltage controlled oscillator both triggering said analog-to-digital convertor and inputting to said phase comparitor, whereby detection of a phase difference, due to frequency changes in said carrier wave, by said phase comparitor causes said dc output of said phase comparitor to change accordingly thereby causing said output of said voltage controlled oscillator to change frequency for triggering said analog-to-digital convertor.

9. The method of claim 8 wherein said preset frequency of said voltage controlled oscillator is said sampling frequency, $f'_{samp}$, wherein said analog signal is primarily 60 Hz and is conditioned with a full wave rectifier and a Schmitt trigger to produce a square wave signal of 120 Hz to said phase comparitor, and wherein said output of said voltage controlled oscillator is divided to achieve said 120 Hz prior to inputting to said phase comparitor.

10. The method of claim 7 further comprising the step of monitoring said output of said phase comparitor for instabilities of said voltage controlled oscillator due to extreme fluctuations of frequency of the carrier wave, and providing an output error signal when said instabilities are determined.

11. A method for motor current signature analysis to determine frequencies in perturbations within the current, the current having a sinusoidal nonstationary carrier wave, said method comprising the steps:

deriving, with a differential transformer inserted into a lead to the motor, an analog signal related to said current having the nonstationary carrier wave; containing the perturbations;

selecting a resolution value, R, for analysis of a discrete data set;

selecting a desired sampling rate, $f_{samp}$, that is at least twice a maximum frequency to be analyzed in said frequencies in said perturbations;

calculating an actual sampling rate, $f'_{samp}$, close to said desired sampling rate, $f_{samp}$, said actual sampling rate, $f'_{samp}$, being equal to a product of the carrier wave frequency, $f_{carrier}$, multiplied by a selected number of samples, m, divided by a selected number of cycles of the carrier wave, where the number of cycles is a whole number;

producing from said actual sampling rate, $f'_{samp}$, a dynamically adjusted sampling rate which varies according to frequency variations in the nonstationary carrier wave, said dynamically adjusted sampling rate achieved by inputting said analog signal into both an analog-to-digital convertor and a phase comparitor, a dc output of said phase comparitor feeding an input to a voltage controlled oscillator preset to a selected frequency, with an output of said voltage controlled oscillator both triggering operation of said analog-to-digital convertor and inputting said phase comparitor, whereby detection of a phase difference, due to frequency changes in said carrier wave, by said phase comparitor causes said dc output of said phase comparitor to change accordingly thereby causing said output of said voltage controlled oscillator to change frequency for triggering said analog-to-digital convertor;

sampling said analog signal said selected number of times, m, at said dynamically adjusted sampling rate to create said discrete data set containing a stationary carrier wave form having said exact whole number of cycles;

performing Discrete Fourier Transform of said discrete data set at said selected resolution value, R, and said dynamically adjusted sampling rate; and analyzing a result of said Discrete Fourier Transform of said discrete data set for frequencies of the perturbations.

12. The method of claim 11 wherein said preset frequency of said voltage controlled oscillator is said actual sampling frequency, $f'_{samp}$, wherein said analog signal is primarily 60 Hz and is conditioned with a full wave rectifier and a Schmitt trigger to produce a square wave signal of 120 Hz to said phase comparitor, and wherein said output of said voltage controlled oscillator is divided to achieve said 120 Hz prior to inputting to said phase comparitor, said method further comprising the step of monitoring said output of said phase comparitor for instabilities of said voltage controlled oscillator due to extreme fluctuations of frequency of the carrier wave, and providing an output error signal when said instabilities are determined.

\* \* \* \* \*